(12) United States Patent
Nagayoshi

(10) Patent No.: US 9,959,221 B2
(45) Date of Patent: May 1, 2018

(54) SEMICONDUCTOR DEVICE, MEMORY ACCESS CONTROL METHOD, AND SEMICONDUCTOR DEVICE SYSTEM FOR DETERMINING RANDOM ACCESS OR BURST ACCESS AS AN ACCESS METHOD FOR AN EXTERNAL ADDRESS SET

(71) Applicant: Renesas Electronics Corporation, Koutou-ku, Tokyo (JP)

(72) Inventor: Isao Nagayoshi, Tokyo (JP)

(73) Assignee: Renesas Electronics Corporation, Tokyo ( * ) Notice: Subject to any disclaimer, the term of this patent is extended or adjusted under 35 U.S.C. 154(b) by 155 days.

(21) Appl. No.: 14/977,232

(22) Filed: Dec. 21, 2015

(65) Prior Publication Data

US 2016/0180918 A1 Jun. 23, 2016

(30) Foreign Application Priority Data

Dec. 22, 2014 (JP) ................................ 2014-258536

(51) Int. Cl.
G11C 11/406 (2006.01)
G06F 13/16 (2006.01)
G11C 7/10 (2006.01)

(52) U.S. Cl.
CPC ........ G06F 13/1636 (2013.01); G11C 7/1018 (2013.01); G11C 7/1072 (2013.01)

(58) Field of Classification Search
CPC ... G06F 13/1636; G06F 13/28; G11C 7/1072; G11C 11/4061

USPC ................................. 711/167, 106, 154; 1/1
See application file for complete search history.

(56) References Cited

U.S. PATENT DOCUMENTS

| | | | | |
|---|---|---|---|---|
| 5,506,810 A | * | 4/1996 | Runas | G11C 7/00 365/189.14 |
| 6,256,221 B1 | * | 7/2001 | Holland | G11C 7/18 365/149 |
| 9,262,355 B2 | * | 2/2016 | Ishii | G06F 13/28 |
| 2012/0317351 A1 | * | 12/2012 | Nishioka | G06F 13/16 711/105 |
| 2014/0059319 A1 | * | 2/2014 | Noro | G06F 12/023 711/171 |

FOREIGN PATENT DOCUMENTS

JP 09-198305 A 7/1997

* cited by examiner

*Primary Examiner* — Daniel C Chappell
*Assistant Examiner* — Edward Waddy, Jr.
(74) *Attorney, Agent, or Firm* — Shapiro, Gabor and Rosenberger, PLLC

(57) ABSTRACT

A semiconductor device (100) according to an embodiment calculates the number of times of burst access for an address set (A) based on a result of a determination, for each of N addresses $a_1$ to $a_n$ (N is a natural number no less than two) included in the address set (A), whether or not the address and another address adjacent to that address in an accessing order can be accessed by the same burst access, and calculates an access time that will be taken for accessing the address set by the burst access.

16 Claims, 15 Drawing Sheets

SEMICONDUCTOR DEVICE, MEMORY ACCESS CONTROL METHOD, AND SEMICONDUCTOR DEVICE SYSTEM FOR DETERMINING RANDOM ACCESS OR BURST ACCESS AS AN ACCESS METHOD FOR AN EXTERNAL ADDRESS SET

CROSS-REFERENCE TO RELATED APPLICATIONS

This application is based upon and claims the benefit of priority from Japanese patent application No. 2014-258536, filed on Dec. 22, 2014, the disclosure of which is incorporated herein in its entirety by reference.

BACKGROUND

The present invention relates to a semiconductor device, a memory access control method, and a semiconductor device system.

An operation circuit such as a CPU (Central Processing Unit), for example, accesses an external memory (main memory) such as an SDRAM (Synchronous Dynamic Random Access Memory) and reads or writes data. It should be noted that when the operation circuit accesses the external memory, an access delay called "latency" occurs. The latency is one of the performance indices of the external memory, and CAS (Column Address Strobe) latency or the like is typical latency. The smaller the latency is, the faster the access can be performed.

The external memory usually supports burst access in which a plurality of addresses are successively accessed by designating one address in addition to random access in which addresses are designated one by one and access is repeatedly performed. The above-mentioned access delay occurs for each address designation. If the plurality of successively-accessed addresses in the burst access are addresses that are actually going to be accessed from now (hereinafter referred to as "target addresses"), the number of times of the address designation can be reduced compared to that in the random access. Therefore, the number of occurrences of the access delay can also be reduced, thus improving the access efficiency.

Japanese Unexamined Patent Application Publication No. H09-198305 discloses a memory control apparatus in which when an address A is first accessed and then an address B is accessed, a time necessary for the burst access is compared with a time necessary for the random access, and the access method having a shorter necessary time is selected.

SUMMARY

The present inventors have found the following problem. Japanese Unexamined Patent Application Publication No. H09-198305 discloses only the case where two target addresses are accessed, i.e., the case where the whole access is completed by performing random access twice or performing burst access once. Therefore, in the technique disclosed in Japanese Unexamined Patent Application Publication No. H09-198305, it is impossible to estimate a necessary time for burst access when access is performed for an address set including a larger number of target addresses and hence burst access could be performed a plurality of times, thus making it impossible to improve the access efficiency by appropriately switching the access between the burst access and the random access.

Other objects to be solved and novel features will be more apparent from the following description in the specification and the accompanying drawings.

A first aspect of the present invention is a semiconductor device in which: the number of times of burst access for an address set is calculated based a result of determination, for each of N addresses (N is a natural number no less than two) included in the address set, whether or not the address and another address adjacent to that address in an accessing order can be accessed by the same burst access; and an access time that will be taken for accessing the address set by the burst access is calculated.

According to the above-described aspect, it is possible to appropriately switch the access between burst access and random access and thereby improve the access efficiency.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
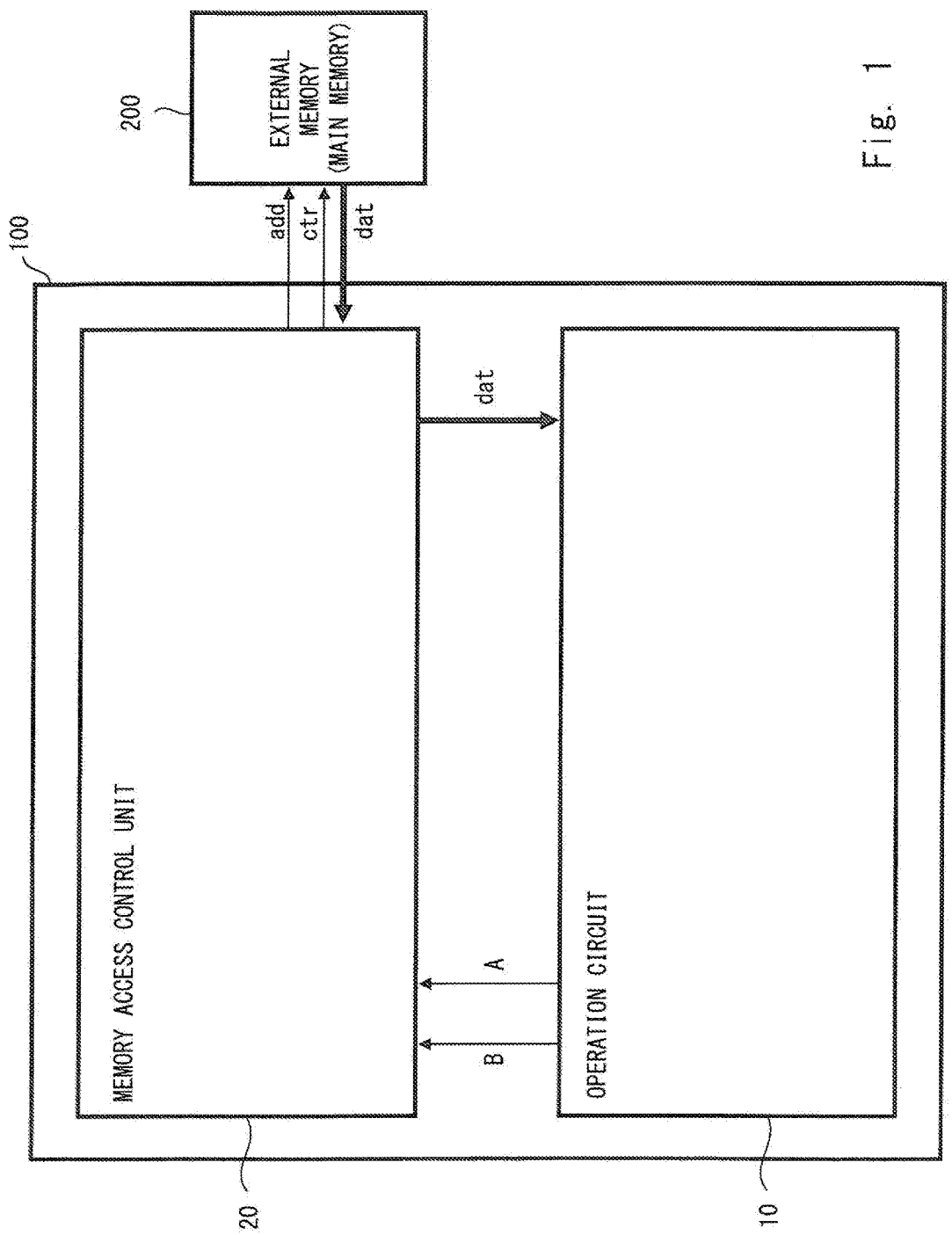
FIG. 1 is a block diagram showing a configuration of a semiconductor device 100 according to a first embodiment.

First Embodiment
<Configuration of Semiconductor Device 100>
Firstly, details of a semiconductor device 100 according to a first embodiment are explained with reference to FIG. 1. FIG. 1 is a block diagram showing a configuration of the semiconductor device 100 according to the first embodiment. The semiconductor device according to the first embodiment is, for example, an LSI (Large Scale Integration) formed in a single semiconductor chip and includes an operation circuit 10 and a memory access control unit 20. The semiconductor device 100 is, as shown in FIG. 1, included in a semiconductor device system together with an external memory (main memory) 200 formed in another semiconductor chip. Note that the external memory (main memory) 200 is an external memory for the semiconductor device 100 and serves as the main memory of the semiconductor device system. The semiconductor device system is, for example, suitable for the purpose of image processing. The semiconductor device 100 accesses the external memory 200, and reads or writes data. Hereinafter, cases where data is read will be explained.

Here, the external memory 200 is, for example, an SDRAM (Synchronous Dynamic Random Access Memory). The external memory 200 supports burst access in which a plurality of addresses are successively accessed by designating one address in addition to random access in which addresses are designated one by one and access is repeatedly performed.

The operation circuit 10 is a processor capable of requesting access to a plurality of addresses of the external memory 200 at one time. For example, the operation circuit 10 is a multi-core CPU (Central Processing Unit). The operation circuit 10 performs various operations using data dat that is read from the external memory 200 and transferred from the memory access control unit 20. The operation circuit 10 outputs an address set signal A, which is a set of addresses in the external memory 200 that are actually going to be accessed from now (hereinafter referred to as "target addresses"), to the memory access control unit 20. That is, the operation circuit 10 can request the memory access control unit 20 to read a plurality of target addresses at one time.

Further, the operation circuit 10 determines, for each of the addresses included in the address set signal A, whether or not the address and another address adjacent to that address in the accessing order can be accessed by the same burst access (i.e., by one burst access operation). Then, the operation circuit 10 outputs a determination flag set signal B, which is a set of determination flags for the respective addresses, to the memory access control unit 20. Alternatively, the memory access control unit 20 may generate the determination flag set signal B based on the address set signal A received from the operation circuit 10.

The memory access control unit 20 is, for example, a DMA (Direct Memory Access) control unit. The memory access control unit 20 determines whether random access is performed or burst access is performed for the external memory 200 based on the address set signal A and the determination flag set signal B.

Specifically, the memory access control unit 20 calculates the number of times of burst access necessary for accessing the address set signal A based on the determination flag set signal B. Then, the memory access control unit 20 calculates an access time that will be taken for accessing the address set signal A by the burst access from the number of times of burst access and compares the calculated access time with an access time that will be taken for accessing the address set signal A by the random access. Then, the memory access control unit 20 selects one of the burst access and the random access that has a shorter access time as the access method. Then, the memory access control unit 20 outputs an access control signal ctr indicating which of the burst access and the random access is selected as the access method as well as an address signal add indicating the address to the external memory 200.

In the semiconductor device 100 according to this embodiment, it is determined, for each of the addresses included in the address set signal A, whether or not the address and another address adjacent to that address in the accessing order can be accessed by the same burst, access (i.e., by one burst access operation). Then, the number of times of burst access necessary for accessing the address set signal A is calculated based on this determination result (determination flag set signal B) and an access time that will be taken for accessing the address set signal A by the burst access is calculated. In this way, the semiconductor device 100 according to this embodiment makes it possible to estimate a necessary time for the burst access for the address set even in the case where the burst access could be performed a plurality of times and thereby improve the access efficiency by appropriately switching the access between the burst access and the random access.

<Detailed Configuration of Semiconductor Device 100>

Figure 2:
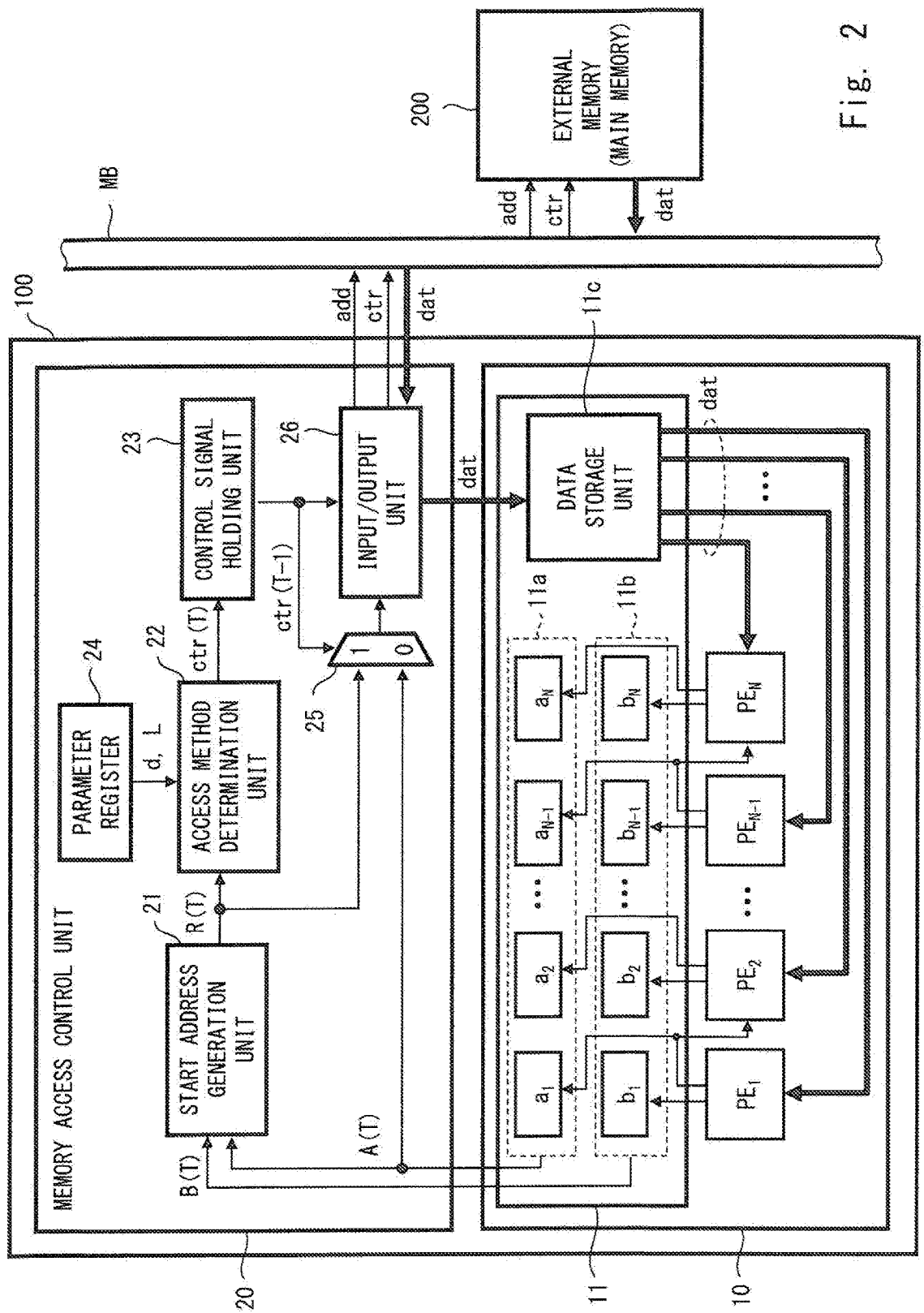
FIG. 2 is a detailed block diagram showing the configuration of the semiconductor device 100 according to the first embodiment.

Next, details of the operation circuit 10 and the memory access control unit 20 are explained with reference to FIG. 2. FIG. 2 is a detailed block diagram showing the configuration of the semiconductor device 100 according to the first embodiment. Note that parameters (an access delay d and a burst length L) that are determined based on the specifications of the external memory 200 are set in the semiconductor device 100. Further, the access delay d is, for example, CAS (Column Address Strobe) latency. The smaller the latency is, the faster the access can be performed.

<Configuration of Operation Circuit 10>

Firstly, the operation circuit 10 is explained. As shown in FIG. 2, the operation circuit 10 is an SIMD (Single Instruction Multiple Data) multi-core processor including N operation cores (or processing elements) $PE_1$ to $PE_N$ (N is a natural number no less than two). The number N is not limited to any particular number but is preferably no less than three. In the case of an SIMD multi-core processor for image processing, N is typically 32, 64, 128, 256 or the like (N=32, 64, 128 or 256). Further, the operation circuit 10 includes an internal memory 11 including an address register 11a, a determination flag register 11b, and a data storage unit 11c.

The N operation cores $PE_1$ to $PE_N$ output their respective target addresses $a_1$ to $a_N$ to the address register 11a in each transfer cycle. Further, the operation cores $PE_1$ to $PE_N$ perform various operations using data dat that is read from the external memory 200 and stored in the data storage unit 11c.

Note that each of the operation cores $PE_1$ to $PE_N$ outputs a respective one of determination flags $b_1$ to $b_N$ indicating whether or not its own target address and another target address immediately prior to that target address in the accessing order can be accessed by the same burst access to the determination flag register 11b in each transfer cycle. For example, the operation core $PE_N$ outputs the determination flag $b_N$ indicating whether or not its own target address $a_N$ and another target address $a_{N-1}$ immediately prior to that target address $a_N$ in the accessing order can be accessed by the same burst access in each transfer cycle. Details of the determination flags $b_1$ to $b_N$ will be described later.

The target addresses $a_1$ to $a_N$ output from the N operation cores $PE_1$ to $PE_N$, respectively, are stored in the address register 11a. These N target addresses $a_1$ to $a_N$ constitute an address set signal A. Note that in the case of random access, the target addresses $a_1$ to $a_N$ are accessed in the order of the target addresses $a_1$, $a_2$, ..., $a_{N-1}$ and $a_N$. These target addresses $a_1$ to $a_N$, i.e., the address set signal A are rewritten in each transfer cycle. In FIG. 2, the address set signal A is expressed as "A(T)", indicating that the address set signal A is a target address set signal in the Tth transfer cycle (T is a natural number).

The determination flags $b_1$ to $b_N$ output from the N operation cores $PE_1$ to $PE_N$, respectively, are stored in the determination flag register 11b. These determination flags $b_1$ to $b_N$ constitute a determination flag set signal B. Note that each of the determination flags $b_1$ to $b_N$ is a flag indicating whether or not the respective one of the target addresses $a_1$ to $a_N$ and another target address adjacent to that target address in the accessing order can be accessed by the same burst access. These determination flags $b_1$ to $b_N$, i.e., the determination flag set signal B are also rewritten in each transfer cycle as in the case of the address set signal A. In FIG. 2, the determination flag set signal B is expressed as "B(T)", indicating that the determination flag set signal B is a determination flag set signal in the Tth transfer cycle.

In this embodiment, each of the determination flags $b_1$ to $b_N$ is a signal having a value 0 or 1 indicating whether or not its target address and another target address immediately prior to that target address in the accessing order can be accessed by the same burst access. In this embodiment, the determination flag has a value 1 when the target addresses can be accessed by the same burst access and has a value 0 when they cannot be accessed by the same burst access. Alternatively, the determination flag may have a value 0 when the target addresses can be accessed by the same burst access and have a value 1 when the target addresses cannot be accessed by the same burst access.

<Method for Generating Determination Flags $b_1$ to $b_N$ in Operation Circuit 10>

Next, a method for generating the determination flags $b_1$ to $b_N$, i.e., method for determining whether or not a target address and another target address immediately prior to that target address in the accessing order can be accessed by the same burst access, is explained.

Firstly, since there is no address that is accessed immediately before the first target address $a_1$, the determination flag $b_1$ output from the operation core $PE_1$ is always 0 in every transfer cycle. Therefore, a method for generating the determination flags $b_2$ to $b_N$ is explained hereinafter.

In general, in burst access having a burst length L, L addresses are accessed by one burst access operation. Specifically, in the case of burst access having a burst length L of 4 (L=4), the values of the four addresses accessed at one time are, for example, (0, 1, 2, 3), (4, 5, 6, 7), (8, 9, 10, 11) or the like. Further, in the case of burst access having a burst length L of 8 (L=8), the value of the eight addresses accessed at one time are, for example, (0, 1, 2, 3, 4, 5, 6, 7), (8, 9, 10, 11, 12, 13, 14, 15) or the like. As shown above, the minimum value of the L address values accessed by one burst access operation is 0 or an integral multiple of the burst length L. Further, the values of the integral parts of the quotients obtained by dividing these L address values by the burst length L are equal to each other.

Therefore, when the values of the integral parts of the quotients "$a_n/L$" and "$a_{n-1}/L$" (n is a natural number between 2 and N) obtained by dividing a target address $a_n$ and another target address $a_{n-1}$ immediately prior to that target address $a_n$ in the accessing order, respectively, by the burst length L are equal to each other, these target addresses $a_n$ and $a_{n-1}$ can be accessed by the same burst access. That is, the determination flag $b_n$ becomes 1 ($b_n$=1). On the other hand, when the values of the integral parts of the quotients "$a_n/L$" and "$a_{n-1}/L$" differ from each other, the target addresses $a_n$ and $a_{n-1}$ cannot be accessed by the same burst access. That is, the determination flag $b_n$ becomes 0 ($b_n$=0). When the above-described relations are expressed by using numerical expressions, they can be expressed as follows.

If INT($a_n/L$)=INT($a_{n-1}/L$), then $b_n$=1

If INT($a_n/L$)≠INT($a_{n-1}/L$), then $b_n$=0

In the above-shown expressions, the function INT(x) means the integral part of the value x.

As described above, each operation core $PE_n$ calculates values "INT($a_n/L$)" and "INT($a_{n-1}/L$)" from its own target address $a_n$ and a target address $a_{n-1}$ output from the operation core $PE_{n-1}$, respectively, and compares them with each other. Then, each operation core $PE_n$ outputs its comparison result as a determination flag $b_n$. The generation of the determination flag $b_n$ in each operation core $PE_n$ can be performed by program processing. Note that the value of the burst length L is usually a power of 2 such as 4, 8, 16 or the like. Therefore, the division "$a_n/L$" in the operation core $PE_n$ can be replaced by a shifting operation and usually can be performed by one-step program processing. Further, the extraction of the integral part of the value "$a_n/L$" and the comparison of the extracted integral part with that of the value "$a_{n-1}/L$" generated by the operation core $PE_{n-1}$ can also be performed by simple program processing. That is, the operation core $PE_1$ to $PE_N$ can generate the determination flags $b_1$ to $b_N$ immediately after generating the target addresses $a_1$ to $a_N$.

Note that although the determination flags $b_1$ to $b_N$ are generated in the operation circuit 10 in this embodiment, they may be generated in the memory access control unit 20. However, in such a case, the memory access control unit 20 needs to be equipped with N comparison circuits for comparing the INT($a_n/L$) with INT($a_{n-1}/L$). As described above, the comparison between the INT($a_n/L$) and INT($a_{n-1}/L$) can be easily performed by program processing in the operation cores $PE_1$ to $PE_N$ in a short time. Therefore, the generation of the determination flags $b_1$ to $b_N$ is preferably performed in the operation circuit 10 as in the case of this embodiment. Specific examples of the determination flags $b_1$ to $b_N$ will be described later.

<Configuration of Memory Access Control Unit 20>

Next, the memory access control unit 20 is explained. As shown in FIG. 2, the memory access control unit 20 includes a start address generation unit 21, an access method determination unit 22, a control signal holding unit 23, a parameter register 24, a selector 25, and an input/output unit 26.

The start address generation unit 21 receives an address set signal A (target addresses $a_1$ to $a_n$) and a determination flag set signal B (determination flags $b_1$ to $b_N$) output from the operation circuit 10. The start address generation unit 21 extracts an address that will be first accessed in each burst access operation (i.e., start address) from the target addresses $a_1$ to $a_N$ based on the determination flags $b_1$ to $b_N$. Note that as shown in FIG. 2, since the signal exchange between the operation circuit 10 and the memory access control unit 20 is performed without using a memory bus MB, the determination of the access method does not occupy the memory bus MB.

Specifically, some (i.e., at least one) of the target addresses $a_1$ to $a_N$ that are determined to be unable to be accessed together with target addresses immediately prior to them by the same burst access (i.e., by performing one burst access) (namely, target addresses for which the values of the respective ones of the determination flags $b_1$ to $b_N$ are zero)

are extracted as start addresses $r_1$ to $r_M$ (M is a natural number). As a result, a start address set signal R including the M start addresses $r_1$ to $r_M$ is generated. Note that the number M of the start addresses $r_1$ to $r_M$ corresponds to the number of times of burst access necessary for accessing all the target addresses $a_1$ to $a_N$. Since the N determination flags $b_1$ to $b_N$ need to be successively read to generate this start address set signal R, the generation of this start address set signal R takes N clock cycles as the processing time.

These start addresses $r_1$ to $r_M$, i.e., the start address set signal R is also rewritten in each transfer cycle. In FIG. 2, the start address set signal R is expressed as "R(T)", indicating that the start address set signal R is a start address set signal in the Tth transfer cycle. Note that specific examples of the start addresses $r_1$ to $r_M$ will be described later.

As shown in FIG. 2, the access method determination unit 22 determines an access method (burst access or random access) based on the start address set signal R output from the start address generation unit 21 while referring to parameters (an access delay d and a burst length L) stored in the parameter register 24. Then, the access method determination unit 22 outputs an access control signal ctr indicating which of burst access and random access is selected as the access method to the control signal holding unit 23.

In this embodiment, the access control signal ctr is a signal having a value 0 or 1 indicating either burst access or random access. Further, the access control signal ctr has a value 1 when the access is burst access and has a value 0 when it is random access. Needless to say, the access control signal ctr may have a value 0 when the access is burst access and has a value 1 when it is random access. This access control signal ctr is also rewritten in each transfer cycle. In FIG. 2, the access control signal ctr is expressed as "ctr(T)", indicating that the access control signal ctr is an access control signal in the Tth transfer cycle.

More specifically, the access method determination unit 22 calculates a burst access time tb that will be taken for accessing the address set signal A by the burst access from the number M of times of burst access (hereinafter also expressed as a "burst access number M"), which is equal to the number of the start addresses $r_1$ to $r_M$. As described above, when the burst access is performed, the generation of the start address set signal R takes N clock cycles, which is equal to the number N of the target addresses (hereinafter also expressed as a "target address number N"). Further, it takes the access delay d (clock cycles) and L clock cycles necessary for accessing L addresses corresponding to the burst length L (words) to perform one burst access operation. Therefore, the burst access time tb (clock cycles) can be expressed by the following expression by using the target address number N (addresses), the burst access number M (number of times), the access delay d (clock cycles), and the burst length L (words).

$$tb=N+M\times(d+L)$$

Note that since the burst access number M changes in each transfer cycle, the burst access time tb also changes in each transfer cycle.

The access method determination unit 22 compares the calculated burst access time tb with a random access time tr that will be taken for accessing the address set signal A by the random access. In the random access, the N target addresses $a_1$ to $a_N$ are accessed one by one. Therefore, the random access time tr (clock cycles) can be expressed by the following expression by using the target address number N (addresses) and the access delay d (clock cycles).

$$tr=N\times d$$

Therefore, the random access time tr is always constant for every transfer cycle.

Then, the access method determination unit 22 selects the access method having a smaller access time. That is when tb<tr, the access method determination unit 22 selects the burst access as the access method and outputs a access control signal ctr having a value 1 (ctr=1). On the other hand, when tb>tr, the access method determination unit 22 selects the random access as the access method and outputs an access control signal ctr having a value 0 (ctr=0). When tb=tr, the access method determination unit 22 may select either the burst access or the random access. In this embodiment, when tb=tr, the access method determination unit 22 selects the burst access and outputs an access control signal ctr having a value 1 (ctr=1).

The control signal holding unit 23 holds the access control signal ctr output from the access method determination unit 22. Then, the control signal holding unit 23 outputs the access control signal ctr to the selector 25 and the input/output unit 26 at a predetermined timing. As shown in FIG. 2, in the Tth transfer cycle, the control signal holding unit 23 captures (i.e., acquires) an access control signal ctr(T), which is an access control signal ctr in the Tth transfer cycle, and outputs an access control signal ctr(T−1), which is an access control signal ctr in the (T−1)th transfer cycle.

The selector 25 receives the address set signal A(T) and the start address set signal R(T) in the Tth transfer cycle. Then, the selector 25 selects either the address set signal A(T) or the start address set signal R(T) based on the access control signal ctr(T−1). Specifically, when the access is the burst access (access control signal ctr(T−1)=1), the selector 25 selects the start address set signal R. On the other hand, when the access is the random access (access control signal ctr(T−1)=0), the selector 25 selects the address set signal A.

It should be noted that the reason why the access control signal ctr(T−1) is used instead of using the access control signal ctr(T) in the Tth transfer cycle is that when the access is the random access, the transfer of the address set signal A(T) is started without waiting for the generation of the start address set signal R(T), which takes N cycles as described above. Further, in the case of image processing or the like, for example, the value of the access control signal ctr(T) is almost always the same as that of the access control signal ctr(T−1). That is, since the frequency with which the values of those control signals differ from each other and hence the inappropriate access method is selected is very small as a whole, the effect on the overall access time caused by the inappropriate access method selection is negligible.

In the Tth transfer cycle, the input/output unit 26 outputs one of the address set signal A and the start address set signal R selected by the selector 25 to the memory bus MB as an address signal add. This address signal add is input to the external memory 200 through the memory bus MB. Further, the input/output unit 26 transfers the access control signal ctr indicating the access method to the external memory 200 through the memory bus MB. Data dat that is read from the external memory 200 in response to the address signal add and the access control signal ctr is input to the input/output unit 26 through the memory bus MB. Then, the input/output 26 transfers the data dat received from the external memory 200 to the data storage unit 11c of the operation circuit 10.

In the semiconductor device 100 according to this embodiment, it is determined, for each of the addresses included in the address set signal A, whether or not the address and another address adjacent to that address in the accessing order can be accessed by the same burst access (i.e., by one burst access operation). Then, the number of times of burst access necessary for accessing the address set signal A is calculated based on this determination result (determination flag set signal B) and an access time that will be taken for accessing the address set signal A by the burst access is calculated. In this way, the semiconductor device 100 according to this embodiment makes it possible to estimate a necessary time for the burst access for the address set even in the case where the burst access could be performed a plurality of times and thereby improve the access efficiency by appropriately switching the access between the burst access and the random access.

Further, in the semiconductor device 100 according to the first embodiment, the N determination flags $b_1$ to $b_N$, each of which indicates, for a respective one of the target addresses $a_1$ to $a_N$ included in the address set signal A, whether or not the address and another address adjacent to (i.e., prior to or subsequent to) that address in the accessing order can be accessed by the same burst access, are generated.

Here, a case where it is determined, for each of the N target addresses $a_1$ to $a_N$, whether or not the target address can be accessed together with each of all the other addresses (i.e., (N−1) addresses) by the same burst access (i.e., by one burst access operation) is examined. In this case, the number of the determinations is expressed as "N×(N−1)". Therefore, in order to complete the determinations in the same time period as that in the above-described semiconductor device 100 according to the first embodiment, it is necessary to increase the amount of the circuit resource necessary for the determinations by a factor of (N−1). Alternatively, when the determinations are made by using the same amount of circuit resource as that in the semiconductor device 100 according to the first embodiment, the determination time increases by a factor of (N−1).

In other words, in the semiconductor device 100 according to the first embodiment, since the determination is made only for addresses that are adjacent to each other in the accessing order, the access method can be determined in a short time by using a small circuit resource. This advantageous effect become more significant as the number N of the target addresses included in the address set signal A increases. Since N is typically 32, 64, 128, 256 or the like (N=32, 64, 126, 256 or the like) as mentioned above, a sufficient advantageous effect can be expected.

Further, since the determination is made by using only addresses that are adjacent to each other in the accessing order, the semiconductor device 100 according to the first embodiment is suitable for cases where the address values of addresses adjacent to each other in the accessing order are close to each other in a section having some degree of range. As shown in the below-shown specific examples, the semiconductor device 100 according to the first embodiment is especially suitable for cases where the address values of addresses adjacent to each other in the accessing order are consecutive values or values at regular intervals.

<Explanation of Operation of Memory Access Control Unit 20>

Figure 3:
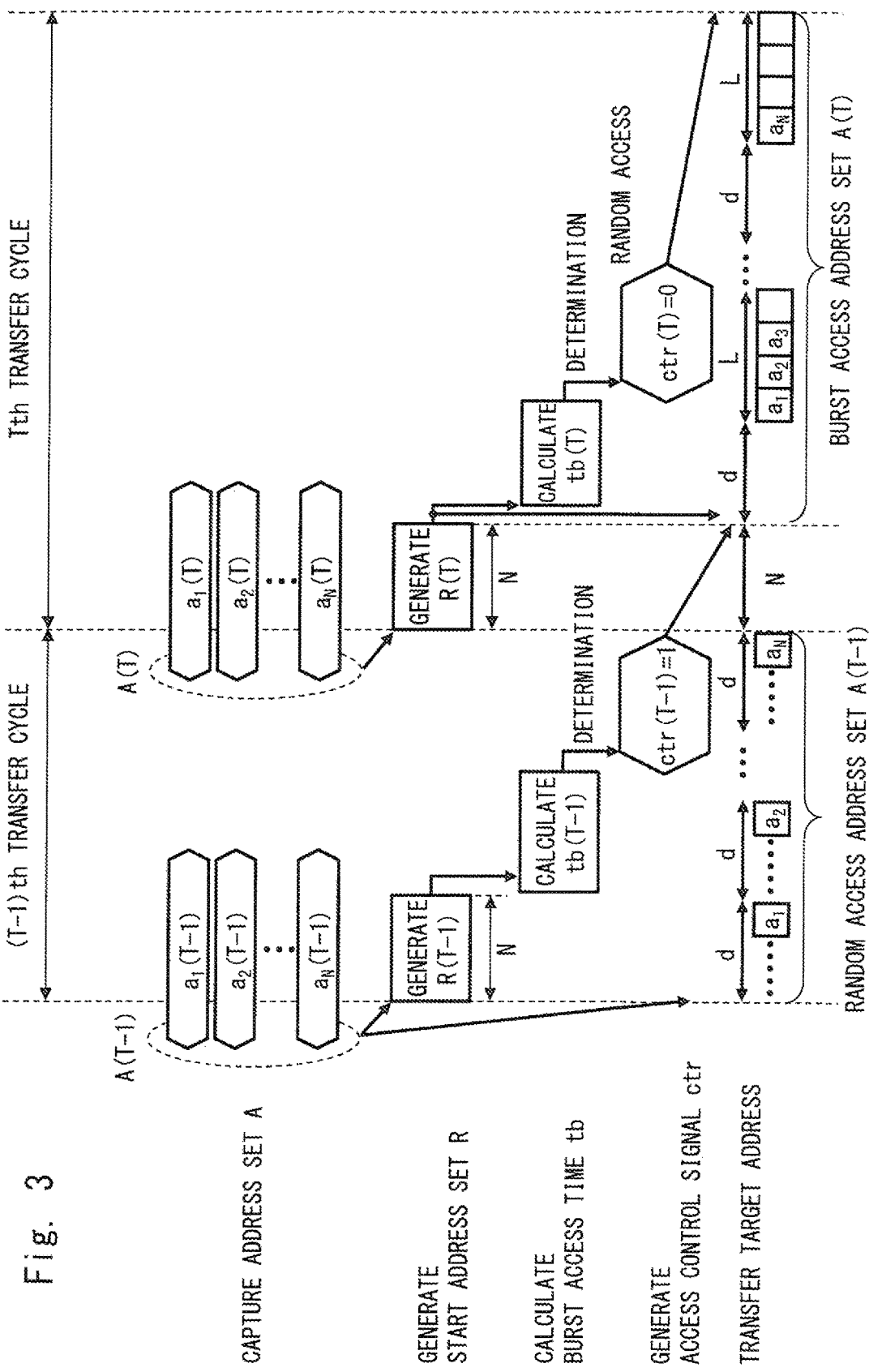
FIG. 3 is a timing chart for explaining an operation of a memory access control unit 20 according to the first embodiment.

Next, an operation of the memory access control unit 20 is explained with reference to FIG. 3. FIG. 3 is a timing chart for explaining an operation of the memory access control unit 20 according to the first embodiment. In FIG. 3, (T−1)th and Tth transfer cycles are shown. Note that the illustration of the determination flag set signal B is omitted in FIG. 3.

Firstly, the (T−1)th transfer cycle is explained.

When the (T−1)th transfer cycle is started, the memory access control unit 20 first captures (i.e., acquires) an address set signal A(T−1) and a determination flag set signal B(T−1) as shown in the uppermost part in FIG. 3.

Next, as shown in the second part from the top in FIG. 3, the start address generation unit 21 generates a start address set signal R(T−1). As described above, the generation of the start address set signal R(T−1) takes N clock cycles.

Next, as shown in the third part from the top in FIG. 3, the access method determination unit 22 calculates a burst access time tb(T−1).

Subsequently, as shown in the fourth part from the top in FIG. 3, the access method determination unit 22 compares the calculated burst access time th(T−1) with a random access time tr and generates a access control signal ctr(T−1). In the example shown in FIG. 3, it is assumed that the access control signal ctr(T−1) is one (ctr(T−1)=1). That is, burst access is selected. As a result, in the Tth transfer cycle, an address set signal A(T) is transferred by the burst access. Note that the access control signal ctr(T−1) is held in the control signal holding unit 23.

Meanwhile, as shown in the lowermost part of FIG. 3, in the (T−1)th transfer cycle, the captured address set signal A(T−1) is transferred by random access. This is because the value of an access control signal ctr(T−2) in the (T−2)th transfer cycle, which has been held in the control signal holding unit 23, was zero (not shown). As shown in the (T−1)th transfer cycle, in the case of the random access, the transfer is started as soon as the address set signal A(T−1) is captured (i.e., acquired) without waiting for the generation of the start address set signal R(T−1).

Next, the Tth transfer cycle is explained.

When the Tth transfer cycle is started, the memory access control unit 20 first captures (i.e., acquires) an address set signal A(T) and a determination flag set signal B(T) as shown in the uppermost part in FIG. 3.

Next, as shown in the second part from the top in FIG. 3, the start address generation unit 21 generates a start address set signal R(T). The generation of the start address set signal R(T) also takes N clock cycles.

Next, as shown in the third part from the top in FIG. 3, the access method determination unit 22 calculates a burst access time tb(T).

Subsequently, as shown in the fourth part from the top in FIG. 3, the access method determination unit 22 compares the calculated burst access time tb(T) with a random access time tr and generates a access control signal ctr(T). In the example shown in FIG. 3, it is assumed that the access control signal ctr(T−1) is zero (ctr(T−1)=0). That is, random access is selected. As a result, in the (T+1)th transfer cycle, an address set signal A(T+1) is transferred by the random access (not shown). Note that the access control signal ctr(T) is held in the control signal holding unit 23.

Meanwhile, as shown in the lowermost part of FIG. 3, in the Tth transfer cycle, the captured address set signal A(T) is transferred by the burst access. This is because the value of the access control signal ctr(T−1), which has been held in the control signal holding unit 23, was the one as described above. In the burst access, the address set signal A(T) is transferred by using the start address set signal R(T). Therefore, as shown in the Tth transfer cycle, the transfer of the address set signal A(T) is started after the start address set signal R(T) is generated.

<Specific Example of Determination Flag $b_n$ and Start Address $r_m$>

Figure 4:
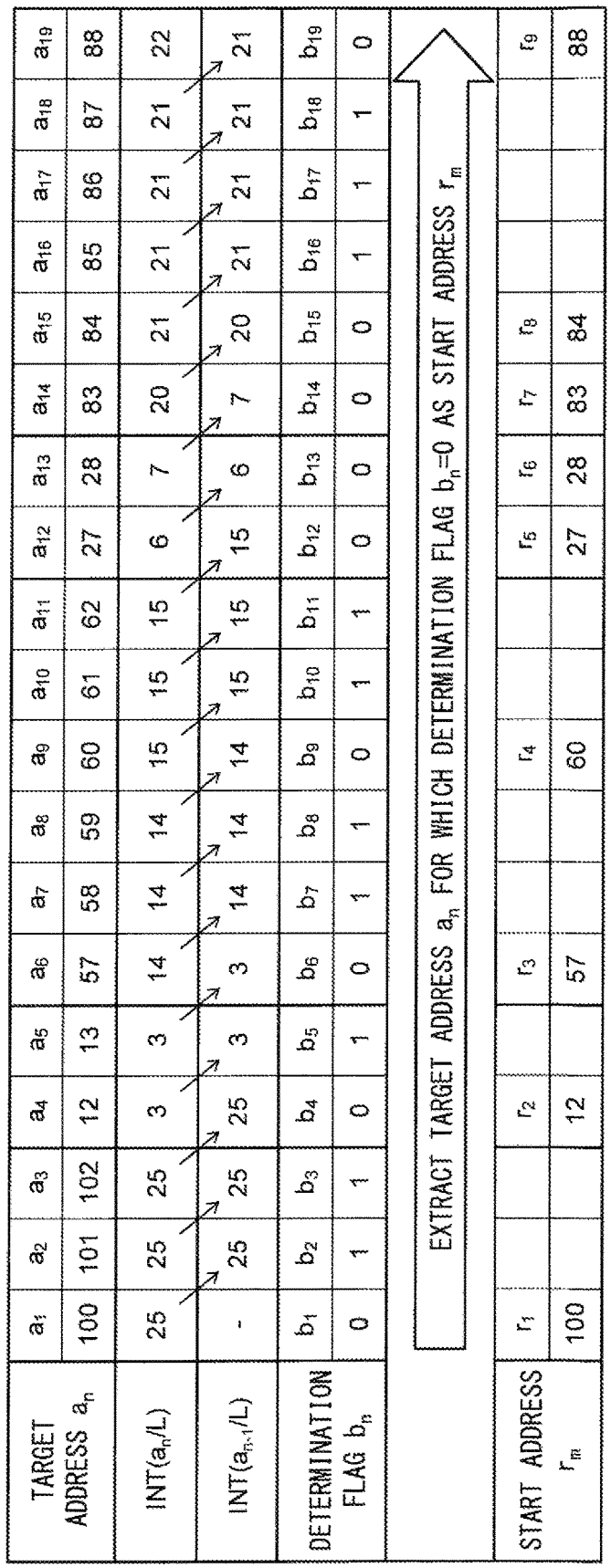
FIG. 4 is a table showing specific examples of determination flags $b_n$ and start addresses $r_m$.

Next, specific examples of the determination flag $b_n$ and the start address $r_m$ are explained. FIG. 4 is a table showing specific examples of the determination flags $b_n$ and the start addresses $r_m$.

In the example shown in FIG. 4, the address signal A incudes 19 target addresses $a_1$ to $a_{19}$ (N=19). On the uppermost row in FIG. 4, the address values of the target addresses $a_1$ to $a_{19}$ are shown. In particular, the address set signal A includes: three consecutive target addresses $a_1$=100, $a_2$=101, and $a_3$=102; two consecutive target addresses $a_4$=12 and $a_5$=13; six consecutive target addresses $a_6$=57, $a_7$=58, $a_8$=59, $a_9$=60, $a_{10}$=61, and $a_{11}$=62; two consecutive target addresses $a_{12}$=27 and $a_{13}$=28; and six consecutive target addresses $a_{14}$=83, $a_{15}$=84, $a_{16}$=85, $a_{17}$=86, $a_{18}$=87, and $a_{19}$=88. Note that the number N of target addresses (N=19) and their address values are chosen just for the explanation purpose.

As shown above, in the example shown in FIG. 4, the address values of addresses adjacent to each other in the accessing order are consecutive in sections having some degree of range (e.g., the target addresses $a_1$, $a_2$ and $a_3$, and the like). In the case of image data, data is often stored at addresses whose address values are consecutive in sections having some degree of range in the external memory 200.

On the second row in FIG. 4, INT($a_n$/L), which are the integral parts of quotients obtained by dividing the target addresses $a_n$ by the burst length L, are shown. In this example, the burst length L is four (L=4).

For the three consecutive target addresses $a_1$ to $a_3$, the values of the integral parts of them are all 25 (INT($a_1$/4) =INT($a_2$/4)=INT($a_3$/4)=25). That is, the values of INT($a_n$/L) are equal to each other. Therefore, the target addresses $a_1$ to $a_3$ can be accessed by the same burst access (i.e., by one burst access operation).

For the two consecutive target addresses $a_4$ and $a_5$, the values of the integral parts of them are both three (INT($a_4$/4)=INT($a_5$/4)=3). That is, the values of INT($a_n$/L) are equal to each other. Therefore, the target addresses $a_4$ and $a_5$ can also be accessed by the same burst access.

For the six consecutive target addresses $a_6$ to $a_{11}$, the values of some of the integral parts are 14 and the values of the other integral parts are 15 (INT($a_6$/4)=INT($a_7$/4)=INT($a_8$/4)=14, INT($a_9$/4)=INT($a_{10}$/4)=INT($a_{11}$/4)=15). That is, the values of INT($a_n$/L) change between the target addresses $a_8$ and $a_9$. Therefore, the target addresses $a_6$ to $a_{11}$ are accessed by performing burst access twice.

For the two consecutive target addresses $a_{12}$ and $a_{13}$, the value of the integral part of the target address $a_{12}$ is six and that of the target address $a_{13}$ is seven (INT($a_{12}$/4)=6, INT($a_{13}$/4)=7). That is, the values of INT($a_n$/L) change just between the target addresses $a_{12}$ and $a_{13}$. Therefore, the target addresses $a_{12}$ and $a_{13}$ are accessed by separately performing burst access twice.

For the six consecutive target addresses $a_{14}$ to $a_{19}$, the values of the integral parts are 20, 21 and 22 (INT($a_{14}$/4)=20, INT($a_{15}$/4)=INT($a_{16}$/4)=INT($a_{17}$/4)=INT($a_{18}$/4)=21, INT($a_{19}$/4)=22). That is, the values of INT($a_n$/L) change between the target addresses $a_{14}$ and $a_{15}$ and between the target addresses $a_{18}$ and $a_{19}$. Therefore, the target addresses $a_{14}$ to $a_{19}$ are accessed by performing burst access three times.

On the third row in FIG. 4, INT($a_{n-1}$/L), which are the integral parts of quotients obtained by dividing the target addresses $a_{n-1}$, which are immediately prior to the target addresses $a_n$, by the burst length L, are shown. As shown in FIG. 4, for the target address $a_1$, there is no target address immediately prior thereto. Therefore, there is no INT($a_{n-1}$/L). For the target address $a_2$, as indicated by the arrow in FIG. 4, the value of INT($a_{n-1}$/4) becomes 25 because the value of INT($a_1$/4) is 25 (INT($a_1$/4)=25) This is also applied to the other target addresses $a_3$ to $a_{19}$ as in the case of the target address $a_2$, and therefore their explanations are omitted.

On the fourth row in FIG. 4, the determination flags $b_1$ to $b_N$ indicating whether or not the relations "INT($a_n$/L)=INT($a_{n-1}$/L)" hold are shown. As mentioned previously, if INT($a_n$/L)=INT($a_{n-1}$/L), then $b_n$=1. Further, if INT($a_n$/L)≠INT($a_{n-1}$/L), then $b_n$=0. Note that the determination flag $b_1$ for the target address $a_1$ is always zero. In the example shown in FIG. 4, the determination flags $b_1$, $b_4$, $b_6$, $b_9$, $b_{12}$, $b_{13}$, $b_{14}$, $b_{15}$ and $b_{19}$ are zero ($b_1$=$b_4$=$b_6$=$b_9$=$b_{12}$=$b_{13}$=$b_{14}$=$b_{15}$=$b_{19}$=0). Further, the other determination flags $b_2$, $b_3$, $b_5$, $b_7$, $b_8$, $b_{10}$, $b_{11}$, $b_{16}$, $b_{17}$ and $b_{18}$ are one ($b_2$=$b_3$=$b_5$=$b_7$=$b_8$=$b_{10}$=$b_{11}$=$b_{16}$=$b_{17}$=$b_{18}$=1)

On the lowermost row in FIG. 4, the start addresses $r_m$ (m is a natural number between 1 to M) are shown. The results of the determination flags $b_n$ shown on the fourth row indicate that all the target addresses $a_1$ to $a_{19}$ can be accessed by performing nine burst access operations in which the start addresses are the target addresses $a_n$ for which the determination flags $b_n$ are zero ($b_n$=0). Therefore, the start address generation unit 21 extracts the target addresses $a_n$ for which the determination flags $b_n$ are zero ($b_n$=0) as the start addresses $r_1$ to $r_M$ (M is a natural number). In the example shown in FIG. 4, the number M is nine (M=9).

Specifically, as shown in FIG. 4, the start addresses and the target addresses are expressed as follows: start address $r_1$=target address $a_1$=100; start address $r_2$=target address $a_4$=12; start address $r_3$z=target address $a_6$=57; start address $r_4$=target address $a_9$=60; start address $r_5$=target address $a_{12}$=27; start address $r_6$=target address $a_{13}$=28; start address $r_7$=target address $a_{14}$=83; start address $r_8$=target address $a_{15}$=84; and start address $r_9$=target address $a_{19}$=88.

Figure 5:
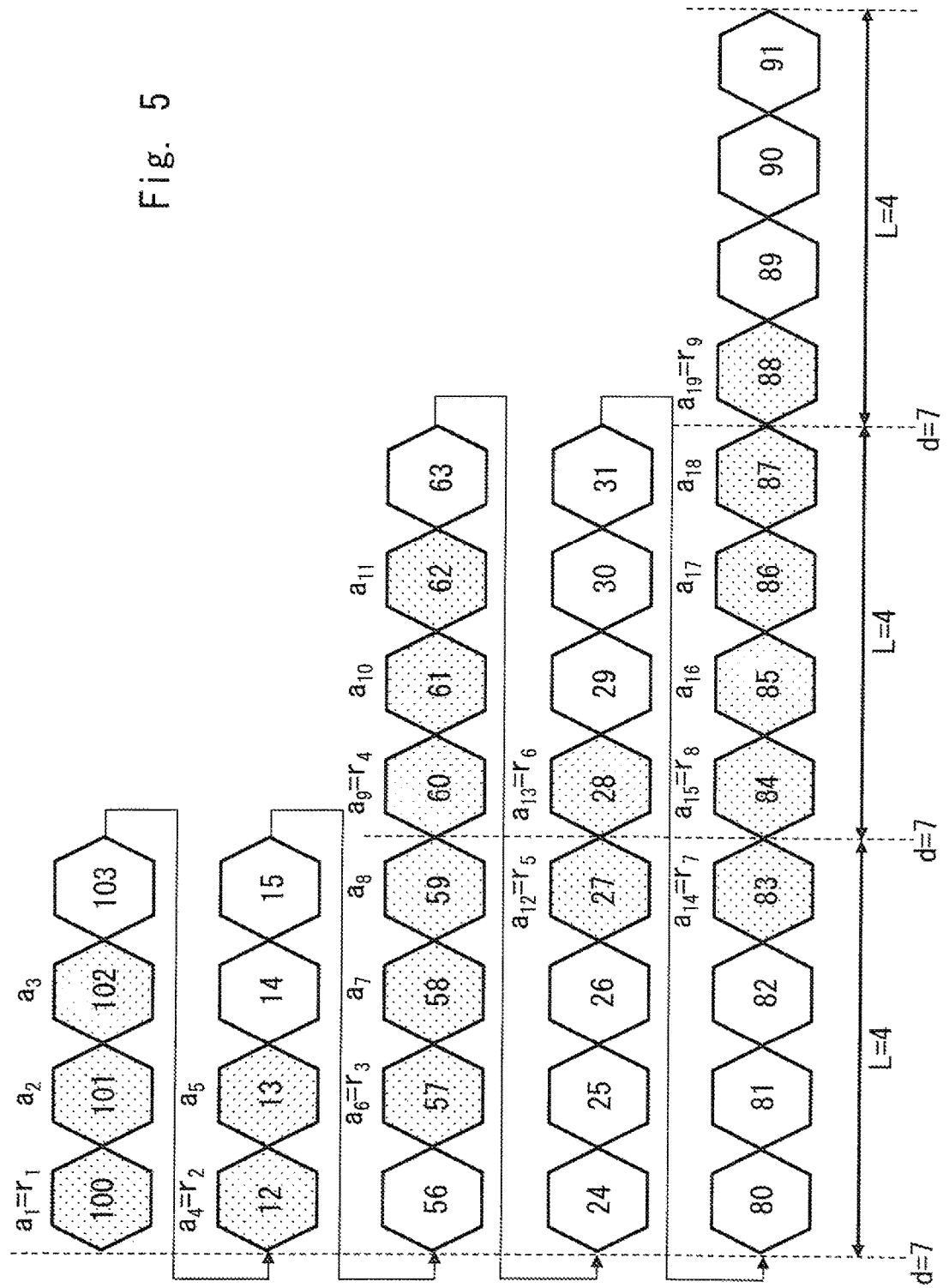
FIG. 5 is a timing chart schematically showing a state where burst access is performed for target addresses $a_1$ to $a_{19}$ shown in FIG. 4.

FIG. 5 is a timing chart schematically showing a state where burst access is performed for the target addresses $a_1$ to $a_{19}$ shown in FIG. 4. Due to the constraint of the paper size, the time advances from the left to the right and from the top to the bottom as indicated by the arrows.

Firstly, target addresses $a_1$=100, $a_2$=101, and $a_3$=102 shown in the uppermost row are accessed by burst access. As explained above with reference to FIG. 4, INT($a_n$/L), which are the integral parts of quotients obtained by dividing the target addresses values by the burst length L (=4), of all the target addresses $a_1$ to $a_3$ are equal to each other. Therefore, the target addresses $a_1$ to $a_3$ are accessed by one burst access operation. The target address $a_1$ becomes the start address $r_1$ of the burst access.

Next, target addresses $a_4$=12 and $a_5$=13 shown in the second row are accessed by burst access. As explained above with reference to FIG. 4, INT($a_n$/L), which are the integral parts of quotients obtained by dividing the target addresses values by the burst length L (=4), of the target addresses $a_4$ and $a_5$ are equal to each other. Therefore, the target addresses $a_4$ and $a_5$ are accessed by one burst access operation. The target address $a_4$ becomes the start address $r_2$ of the burst access.

Next, target addresses $a_6$=57, $a_7$=58, $a_8$=59, $a_9$=60, $a_{10}$=61, and $a_{11}$=62 shown in the third row are accessed by burst access. As explained above with reference to FIG. 4, the values of INT($a_n$/L) of the target addresses $a_6$ to $a_{11}$ change between the target addresses $a_8$ and $a_9$. Therefore, the target addresses $a_6$ to $a_{11}$ are accessed by performing burst access twice. The target addresses $a_6$ and $a_9$ become the start addresses $r_3$ and $r_4$, respectively, of the burst access.

Next, target addresses $a_{12}$=27 and $a_{13}$=28 shown in the fourth row are accessed by burst access. As explained above with reference to FIG. 4, the values of INT($a_n$/L) of the target addresses $a_{12}$ and $a_{13}$ change just between the target addresses $a_{12}$ and $a_{13}$. Therefore, the target addresses $a_{12}$ and $a_{13}$ are accessed by performing burst access twice. The target addresses $a_{12}$ and $a_{13}$ become the start addresses $r_5$ and $r_6$, respectively, of the burst access.

Lastly, target addresses $a_{14}$=83, $a_{15}$=84, $a_{16}$=85, $a_{17}$=86, $a_{18}$=87, and $a_{19}$=88 shown in the lowermost row are accessed by burst access. As explained above with reference to FIG. 4, the values of INT($a_n$/L) of the target addresses $a_{14}$ to $a_{19}$ change between the target addresses $a_{14}$ and $a_{15}$ and between the target addresses $a_{18}$ and $a_{19}$. Therefore, the target addresses $a_{14}$ to $a_{19}$ are accessed by performing burst access three times. The target addresses $a_{14}$, $a_{15}$ and $a_{19}$ become the start addresses $r_7$, $r_8$ and $r_9$, respectively, of the burst access.

Here, a burst access time tb (clock cycles) that is taken when the 19 target addresses $a_1$ to $a_{19}$ shown in FIGS. 4 and 5 are accessed by burst access is calculated. As described previously, the burst access time tb (clock cycles) can be calculated by the expression "tb=N+M×(d+L)". Note that in the specific example shown in FIGS. 4 and 5, the variables are as follows: Target address number N (addresses)=19; Burst access number M=9 (number of times); Access delay d=7 (clock cycles); and Burst length L=4 (words).

Therefore, the burst access time tb is 118 (clock cycles) (tb=19+9×(7+4)=118 (clock cycles)).

Note that FIG. 5 schematically shows that an access delay d (d=7) (clock cycles) occurs in each burst access operation. Further, FIG. 5 also schematically shows that since four addresses corresponding to the burst length L are accessed in each burst access operation, each burst access operation takes four clock cycles.

In contrast to this, a random access time tr (clock cycles) that is taken when the 19 target addresses $a_1$ to $a_{19}$ shown in FIG. 4 are accessed by random access can be calculated by the expression "tr=N×d".

Therefore, the random access time tr is 133 (clock cycles) (tr=19×7=133 (clock cycles)).

That is, in the case of the 19 target addresses $a_1$ to $a_{19}$ shown in FIG. 4, since a relation "burst access time tb<random access time tr" holds, the burst access is selected.

<Other Specific Example of Determination Flag $b_n$ and Start Address $r_m$>

Figure 6:
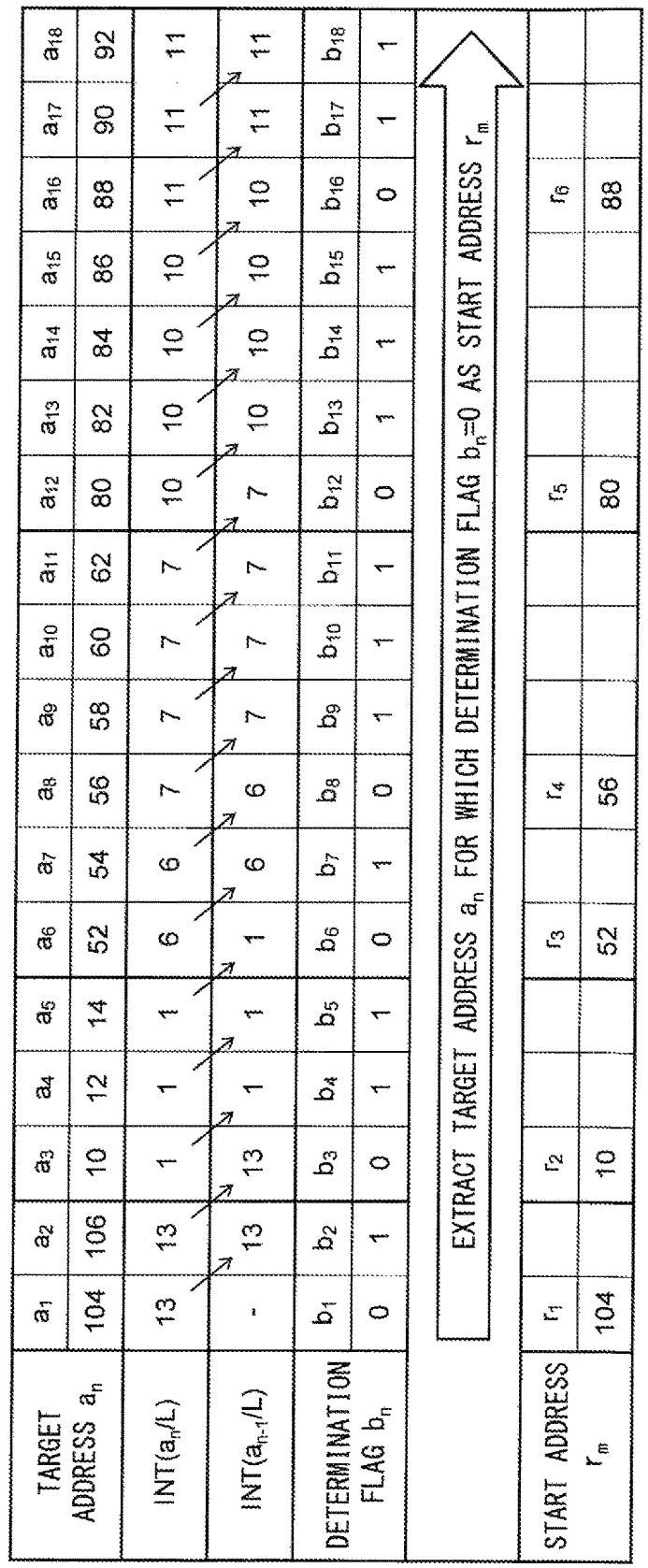
FIG. 6 is a table showing another specific example of determination flags $b_n$ and start addresses $r_m$.

Next, other specific examples of the determination flag $b_n$ and the start address $r_m$ are explained. FIG. 6 is a table showing other specific examples of the determination flags $b_n$ and the start addresses $r_m$. In the example shown in FIG. 4, address values of target addresses adjacent to each other in the accessing order are consecutive in sections having some degree of range. In contrast to this, in the example shown in FIG. 6, address values of target addresses adjacent to each other in the accessing order are consecutive at intervals of two (i.e., they are every other address) in sections having some degree of range. Further, while the burst length L is four (L=4) in the example shown in FIG. 4, the burst length L is eight (L=8) in the example shown in FIG. 6.

As described previously, the semiconductor device 100 according to the first embodiment makes determination by using only addresses that are adjacent to each other in the accessing order. Therefore, as shown in the below-shown example, the addresses that are adjacent to each other in the accessing order do not necessarily need to be consecutive, though they are preferably close to each other in sections having some degree of range.

In the example shown in FIG. 6, the address set signal A includes 18 target addresses $a_1$ to $a_{18}$ (N=18). On the uppermost row in FIG. 6, the address values of the target addresses $a_1$ to $a_{18}$ are shown. In particular, the address set signal A includes: two target addresses that are consecutive at intervals of two (i.e., they are every other address), i.e., $a_1$=104 and $a_2$=106; three target addresses consecutive at intervals of two, i.e., $a_3$=10, $a_4$=12 and $a_5$=14; six target addresses consecutive at intervals of two, i.e., $a_6$=52, $a_7$=54, $a_8$=56, $a_9$=58, $a_{10}$=60 and $a_{11}$=62; and seven target addresses consecutive at intervals of two, i.e., $a_{12}$=80, $a_{13}$=82, $a_{14}$=84, $a_{15}$=86, $a_{16}$=88, $a_{17}$=90 and $a_{18}$=92. Note that the number of target addresses (N=18) and their address values are chosen just for the explanation purpose.

On the second row in FIG. 6, INT($a_n$/L), which are the integral parts of quotients obtained by dividing the target addresses $a_n$ by the burst length L (L=8), are shown.

For the two target addresses $a_1$ and $a_2$ that are consecutive at intervals of two, the values of the integral parts of them are both 13 (INT($a_1$/8)=INT($a_2$/8)=13). That is, the values of INT($a_n$/L) are equal to each other. Therefore, the target addresses $a_1$ and $a_2$ can be accessed by the same burst access.

For the three target addresses $a_3$ to $a_5$ that are consecutive at intervals of two, the values of the integral parts of them are all 1 (INT($a_3$/8)=INT($a_4$/8)=INT($a_5$/8)=1). That is, the values of INT($a_n$/L) are equal to each other. Therefore, the target addresses $a_3$ to $a_5$ can be accessed by the same burst access.

For the six target addresses $a_6$ to $a_{11}$ that are consecutive at intervals of two, the values of some of the integral parts are 6 and the values of the other integral parts are 7 (INT($a_6$/8)=INT($a_7$/8)=6, INT($a_8$/8)=INT($a_9$/8)=INT($a_{10}$/8)=INT($a_{11}$/8)=7). That is, the values of INT($a_n$/L) change between the target addresses $a_7$ and $a_8$. Therefore, the target addresses $a_6$ to $a_{11}$ are accessed by performing burst access twice.

For the seven target addresses $a_{12}$ to $a_{18}$ that are consecutive at intervals two, the values of some of the integral parts are 10 and the values of the other integral parts are 11 (INT($a_{12}$/8)=INT($a_{13}$/8)=INT($a_{14}$/8)=INT($a_{15}$/8)=10, INT($a_{16}$/8)=INT($a_{17}$/8)=INT($a_{18}$/8)=11). That is, the values of INT($a_n$/L) change between the target addresses $a_{15}$ and $a_{16}$. Therefore, the target addresses $a_{12}$ to $a_{18}$ are accessed by performing burst access twice.

On the third row in FIG. 6, INT($a_{n-1}$/L), which are the integral parts of quotients obtained by dividing the target addresses $a_{n-1}$, which are immediately prior to the target addresses $a_n$, by the burst length L, are shown. As shown in FIG. 6, for the target address $a_1$, there is no target address immediately prior thereto. Therefore, there is no INT($a_{n-1}$/L). For the target address $a_2$, as indicated by the arrow in FIG. 6, the value of INT($a_{n-1}$/4) becomes 13 because the value of INT($a_1$/4) is 13 (INT($a_1$/4)=13) This is also applied to the other target addresses $a_3$ to $a_{18}$ as in the case of the target address $a_2$, and therefore their explanations are omitted.

On the fourth row in FIG. 6, the determination flags $b_1$ to $b_z$ indicating whether or not the relations "INT($a_n$/L)=INT($a_{n-1}$/L)" hold are shown. As mentioned previously, If INT($a_n$/L)=INT($a_{n-1}$/L), then $b_n$=1. Further, if INT($a_n$/L)≠INT($a_{n-1}$/L), then $b_n$=0. Note that the determination flag $b_1$ for the target address $a_1$ is always zero. In the example shown in FIG. 6, the determination flags $b_1$, $b_3$, $b_6$, $b_8$, $b_{12}$ and $b_{16}$ are zero ($b_1$=$b_3$=$b_6$=$b_8$=$b_{12}$=$b_{16}$=0). Further, the other determination flags $b_2$, $b_4$, $b_5$, $b_7$, $b_9$, $b_{10}$, $b_{11}$, $b_{13}$, $b_{14}$, $b_{15}$, $b_{16}$, $b_{17}$ and $b_{18}$ are one ($b_2$=$b_4$=$b_5$=$b_7$=$b_9$=$b_{10}$=$b_{11}$=$b_{13}$=$b_{14}$=$b_{15}$=$b_{17}$=$b_{18}$=1)

On the lowermost row in FIG. 6, the start addresses $r_m$ (m is a natural number between 1 to M) are shown. The results of the determination flags $b_n$ shown on the fourth row indicate that all the target addresses $a_1$ to $a_{18}$ can be accessed by performing six burst access operations in which the start addresses are the target addresses $a_n$ for which the determination flags $b_n$ are zero ($b_n$=0). Therefore, the start address generation unit 21 extracts the target addresses $a_n$ for which the determination flags $b_n$ are zero ($b_n$=0) as the start addresses $r_1$ to $r_M$ (M is a natural number). In the example shown in FIG. 6, the number M is nine (M=6).

Specifically, as shown in FIG. 6, the start addresses and the target addresses are expressed as follows: start address $r_1$=target address $a_1$=104; start address $r_2$=target address $a_3$=10; start address $r_3$=target address $a_6$32 52; start address $r_4$=target address $a_8$=56; start address $r_5$=target address $a_{12}$=80; and start address $r_6$=target address $a_{16}$=88.

Figure 7:
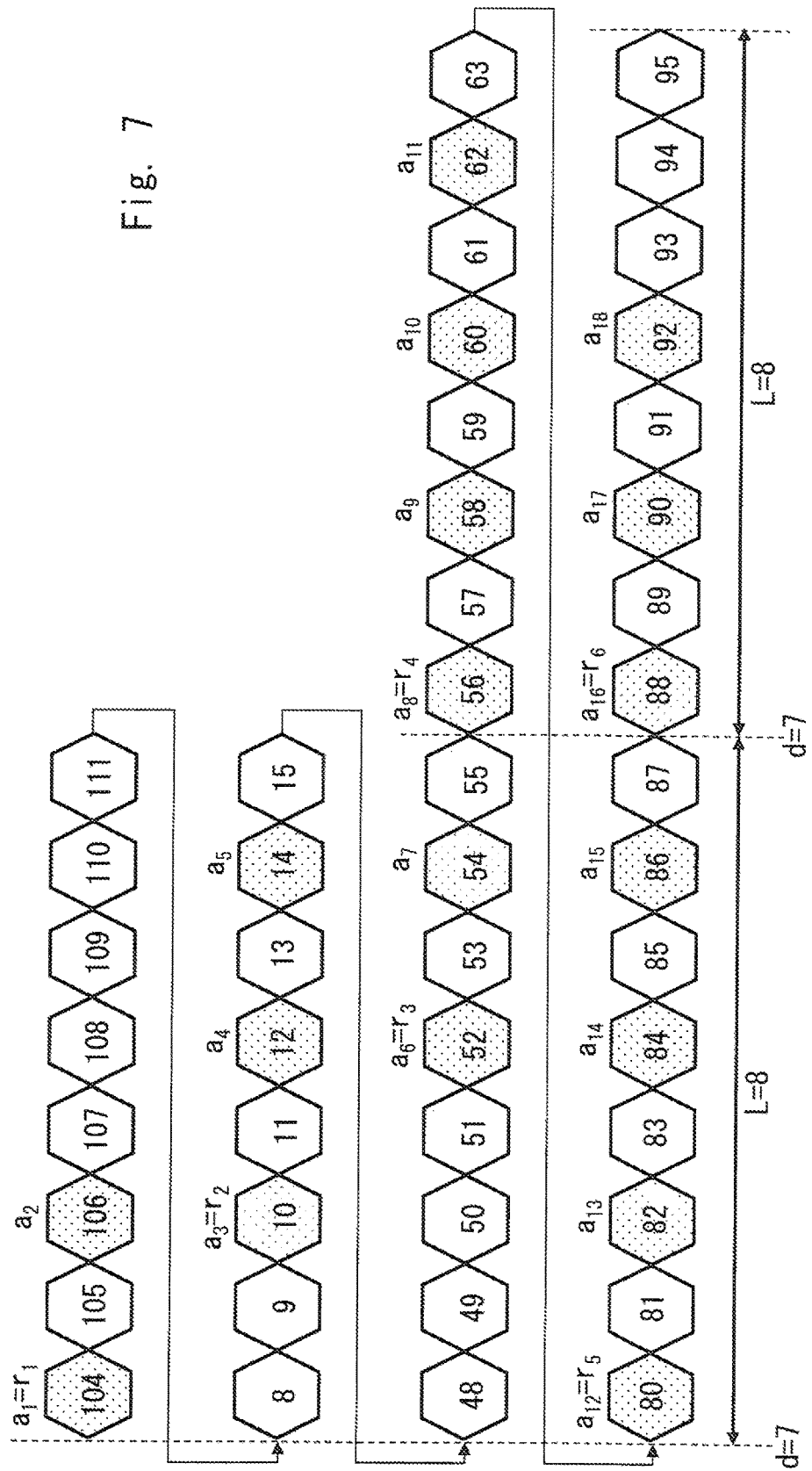
FIG. 7 is a timing chart schematically showing a state where burst access is performed for target addresses $a_1$ to $a_{18}$ shown in FIG. 6.

FIG. 7 is a timing chart schematically showing a state where burst access is performed for the target addresses $a_1$ to $a_{18}$ shown in FIG. 6. Due to the constraint of the paper size, the time advances from the left to the right and from the top to the bottom as indicated by the arrows.

Firstly, target addresses $a_1$=104 and $a_2$=106 shown in the uppermost row are accessed by burst access. As explained above with reference to FIG. 6, INT($a_n$/L), which are the integral parts of quotients obtained by dividing the target addresses values by the burst length L (=8) of the target addresses $a_1$ and $a_2$ are equal to each other. Therefore, the target addresses $a_1$ and $a_2$ are accessed by one burst access operation. The target address $a_1$ becomes the start address $r_1$ of the burst access.

Next, target addresses $a_3$=10, $a_4$=12, and $a_5$=14 shown in the second row are accessed by burst access. As explained above with reference to FIG. 6, INT($a_n$/L), which are the integral parts of quotients obtained by dividing the target addresses values by the burst length L (=8), of all the target addresses $a_3$ to $a_5$ are equal to each other. Therefore, the target addresses $a_3$ to $a_5$ are accessed by one burst access operation. The target address $a_3$ becomes the start address $r_2$ of the burst access.

Next, target addresses $a_6$=52, $a_7$=54, $a_8$=56, $a_9$=58, $a_{10}$=60, and $a_{11}$=62 shown in the third row are accessed by burst access. As explained above with reference to FIG. 6, the values of INT($a_n$/L) of the target addresses $a_6$ to $a_{11}$ change between the target addresses $a_7$ and $a_8$. Therefore, the target addresses $a_6$ to $a_{11}$ are accessed by performing burst access twice. The target addresses $a_6$ and $a_8$ become the start addresses $r_3$ and $r_4$, respectively, of the burst access.

Lastly, target addresses $a_{12}$=80, $a_{13}$=82, $a_{14}$=84, $a_{15}$=86, $a_{16}$=88, $a_{17}$=90, and $a_{18}$=92 shown in the lowermost row are accessed by burst access. As explained above with reference to FIG. 6, the values of INT($a_n$/L) of the target addresses $a_{12}$ to $a_{18}$ change between the target addresses $a_{15}$ and $a_{16}$. Therefore, the target addresses $a_{12}$ to $a_{18}$ are accessed by performing burst access twice. The target addresses $a_{12}$ and $a_{16}$ become the start addresses $r_5$ and $r_6$, respectively, of the burst access.

Here, a burst access time tb (clock cycles) that is taken when the 18 target addresses $a_1$ to $a_{18}$ shown in FIGS. 6 and 7 are accessed by burst access is calculated. As described previously, the burst access time tb (clock cycles) can be calculated by the expression "tb=N+M×(d+L)". Note that in the specific example shown in FIGS. 6 and 7, the variables are as follows: Target address number N (addresses)=18; Burst access number M=6 (number of times); Access delay d=7 (clock cycles); and Burst length L=8 (words).

Therefore, the burst access time tb is 108 (clock cycles) (tb=18+6×(7+8)=108 (clock cycles)).

Note that FIG. 7 schematically shows that an access delay d (d=7) (clock cycles) occurs in each burst access operation. Further, FIG. 7 also schematically shows that since eight addresses corresponding to the burst length L are accessed in each burst access operation, each burst access operation takes eight clock cycles.

In contrast to this, a random access time tr (clock cycles) that is taken when the 18 target addresses $a_1$ to $a_{18}$ shown in FIG. 6 are accessed by random access is calculated can be calculated by the expression "tr=N×d".

Therefore, the random access time tr is 126 (clock cycles) (tr=18×7=126 (clock cycles)).

That is, in the case of the 18 target addresses $a_1$ to $a_{18}$ shown in FIG. 6, since a relation "burst access time tb<random access time tr" holds, the burst access is selected.

<Explanation of Memory Access Control Method>

Figure 8:
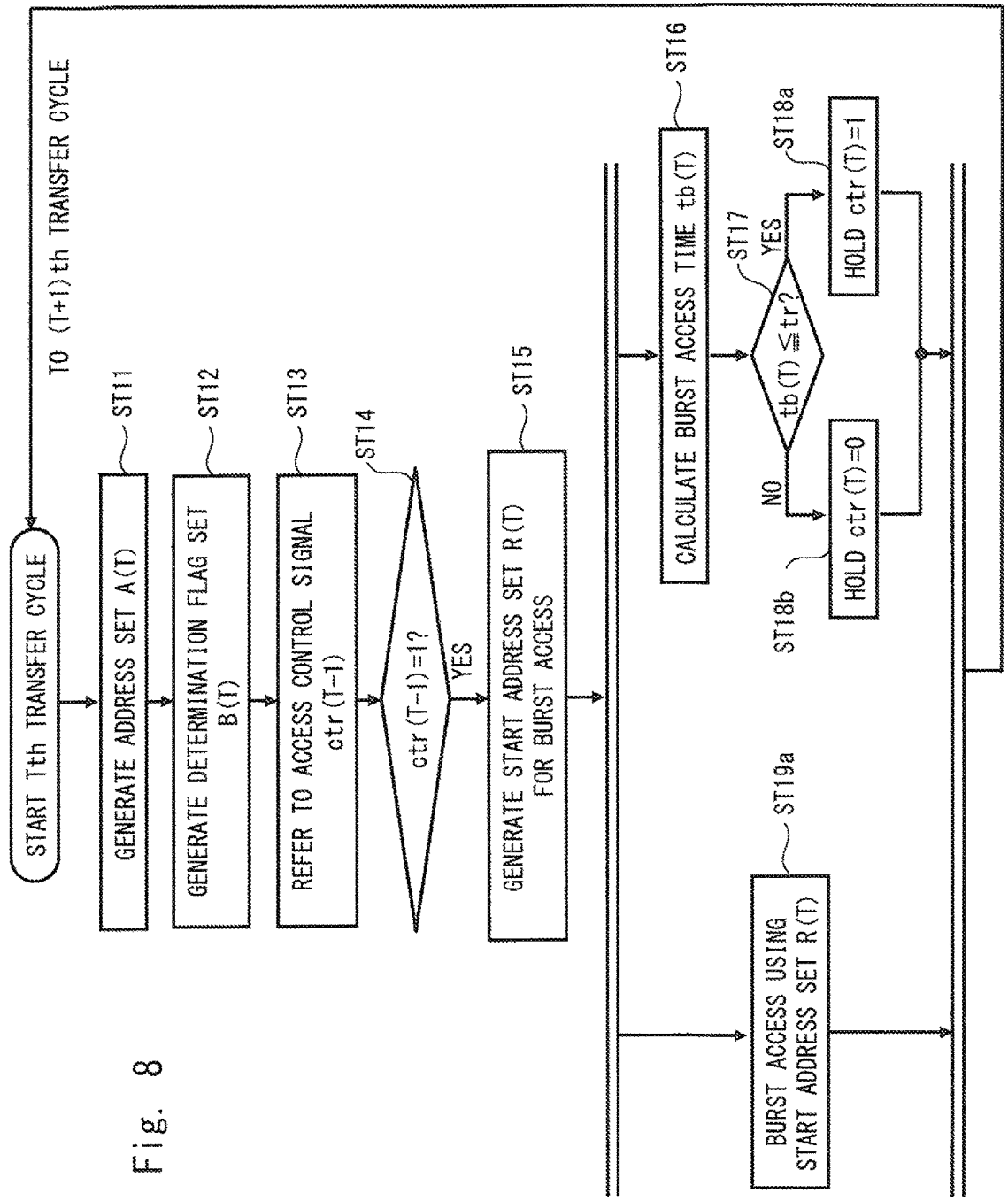
FIG. 8 is a flowchart for explaining a memory access control method according to the first embodiment.
Figure 9:
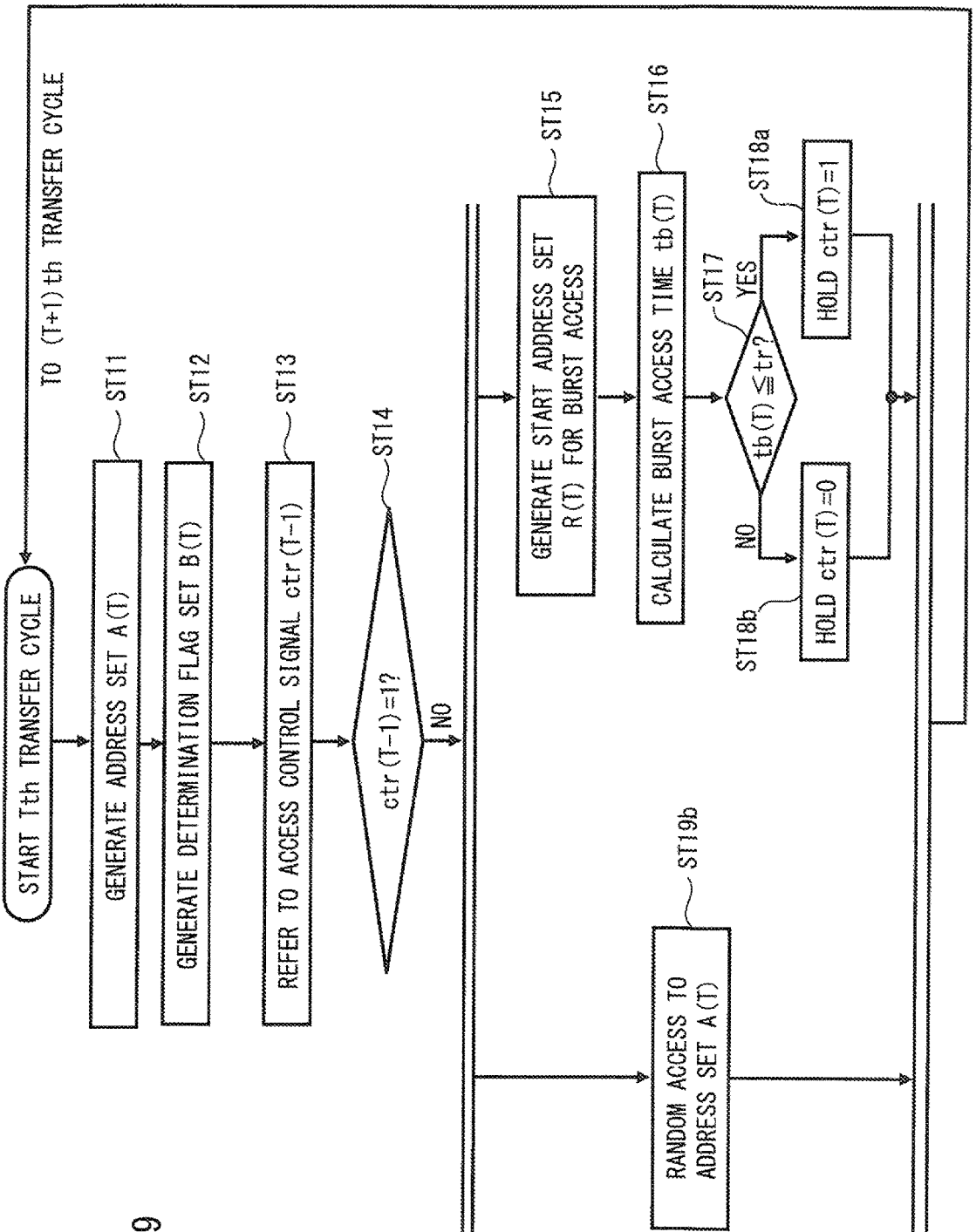
FIG. 9 is a flowchart for explaining a memory access control method according to the first embodiment.

Next, a memory access control method according to the first embodiment is explained with reference to FIGS. 8 and 9. FIGS. 8 and 9 are flowcharts for explaining a memory access control method according to the first embodiment. FIGS. 8 and 9 show two sections of one flowchart, which is divided into the two sections due to the constraint of the paper size. Specifically, FIG. 8 shows a case where a determination result in a step ST14 (which is explained later) is Yes. FIG. 9 shows a case where the determination result in the step ST14 (which is explained later) is No. FIGS. 8 and 9 both show a memory access control method in the Tth transfer cycle.

As shown in FIG. 8, when the Tth transfer cycle is started, the operation cares $PE_1$ to $PE_N$ first generate their target addresses $a_1$ to $a_N$ (address set signal A(T)) in the operation circuit 10 (step ST11).

Subsequently, each of the operation cores $PE_1$ to $PE_N$ generates a respective one of the determination flags $b_1$ to $b_N$ (determination flag set signal B(T)) indicating whether or not its own target address and another target address immediately prior to that target address in the accessing order can be accessed by the same burst access (i.e., by one burst access operation) (step ST12).

Next, the memory access control unit 20 refers to an access control signal ctr(T−1), which is an access control signal ctr in the (T−1)th transfer cycle, held in the control signal holding unit 23 (step ST13).

When the access control signal ctr(T−1) is one (ctr(T−1)=1), i.e., when the access is burst access (Yes at step ST14), the start address generation unit 21 generates a start address set signal R(T) for the burst access (step ST15).

After that, the memory access control unit 20 accesses the address set signal A(T) by the burst access by using the generated start address set signal R(T) (step ST19a). After the step 19a is finished, the process moves to the (T+1)th transfer cycle.

As shown in FIG. 8, the access method determination unit 22 Performs the following process in parallel with the step ST19a. The access method determination unit 22 calculates a burst access time tb(T) (step ST16) and compares the calculated burst access time tb(T) with a random access time tr (step ST17). When tb(T)≤tr. (Yes at step ST17), the access method determination unit 22 stores an access control signal ctr(T) having a value 1 (ctr(T)=1) indicating the burst access into the control signal holding unit 23 (step ST18a). When tb(T)>tr (No at step ST17), the access method determination unit 22 stores an access. control signal ctr(T) having a value 0 (ctr(T)=0) indicating the random access into the control signal holding unit 23 (step ST18b).

Next, a case where the determination result in the step ST14 is No is explained with reference to FIG. 9. Steps to which the same symbols as those in FIG. 8 are assigned are the same processes as those in FIG. 8, and therefore their explanations are omitted.

As shown in FIG. 9, when the access control signal ctr(T−1) is zero (ctr(T−1)=0), i.e., when the access is the random access (No at step ST14), the address set signal A(T) is immediately accessed by the random access (step ST19b) without waiting for the generation of the start address set signal R (step ST15). After the step 19b is finished, the process moves to the (T+1)th transfer cycle.

As shown in FIG. 9, the above-described steps S15 to ST17 and the steps ST18a and ST18b are performed in parallel with the step ST19a.

As described above, in the case of the burst access shown in FIG. 8 (Yes at step ST14), after the start address set signal R(T) is generated (step ST15), the address set signal A(T) is accessed by the burst access by using the generated start address set signal R(T) (step ST19a).

On the other hand, in the case of the random access shown in FIG. 9 (No at step ST14), the address set signal A(T) is immediately accessed by the random access (step ST19b) without waiting for the generation of the start address set signal R(T) (step ST15). In this case, the generation of the start address set signal R is performed (step ST15) in parallel with the random access to the address set signal A(T) (step ST19b).

Second Embodiment
<Configuration of Semiconductor Device 100>

Figure 10:
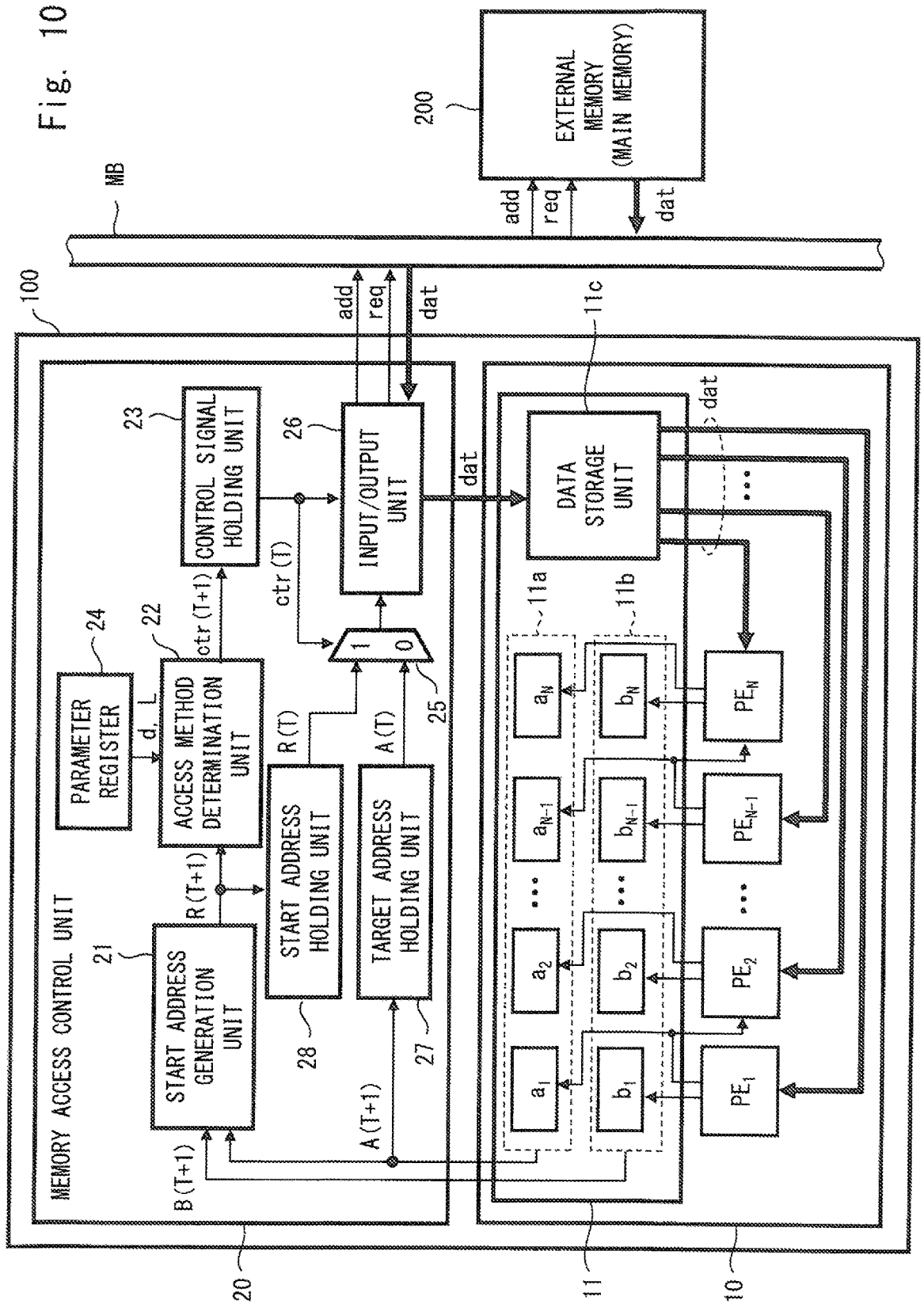
FIG. 10 is a block diagram showing a configuration of a semiconductor device 100 according to a second embodiment.

Next, details of a semiconductor device 100 according to a second embodiment are explained with reference to FIG. 10. FIG. 10 is a block diagram showing a configuration of the semiconductor device 100 according to the second embodiment. When compared to the semiconductor device 100 according to the first embodiment shown in FIG. 2, the semiconductor device 100 according to the second embodiment further includes a target address holding unit 27 and a start address holding unit 28. The other configuration of the semiconductor device 100 according to the second embodiment is similar to that of the semiconductor device 100 according to the first embodiment.

The target address holding unit 27 holds an address set signal A (target addresses $a_1$ to $a_N$) output from the operation circuit 10 and outputs the held address set signal A to the selector 25. Note that as shown in FIG. 10, in the Tth transfer cycle, the target address holding unit 27 captures (i.e., acquires) an address set signal A(T+1), which is an address set signal A in the (T+1)th transfer cycle, and outputs an address set signal A(T), which is an address set signal A in the Tth transfer cycle, to the selector 25.

The start address holding unit 28 holds a start address set signal R (start addresses $r_1$ to $r_M$) generated by the start address generation unit 21 and outputs the held start address set signal R to the selector 25. Note that as shown in FIG. 10, in the Tth transfer cycle, the start address holding unit 28 captures (i.e., acquires) a start address set signal R(T+1), which is a start address set signal R in the (T+1)th transfer cycle, and outputs a start address set signal R(T), which is a start address set signal R in the Tth transfer cycle, to the selector 25.

<Explanation of Operation of Memory Access Control Unit 20>

Figure 11:
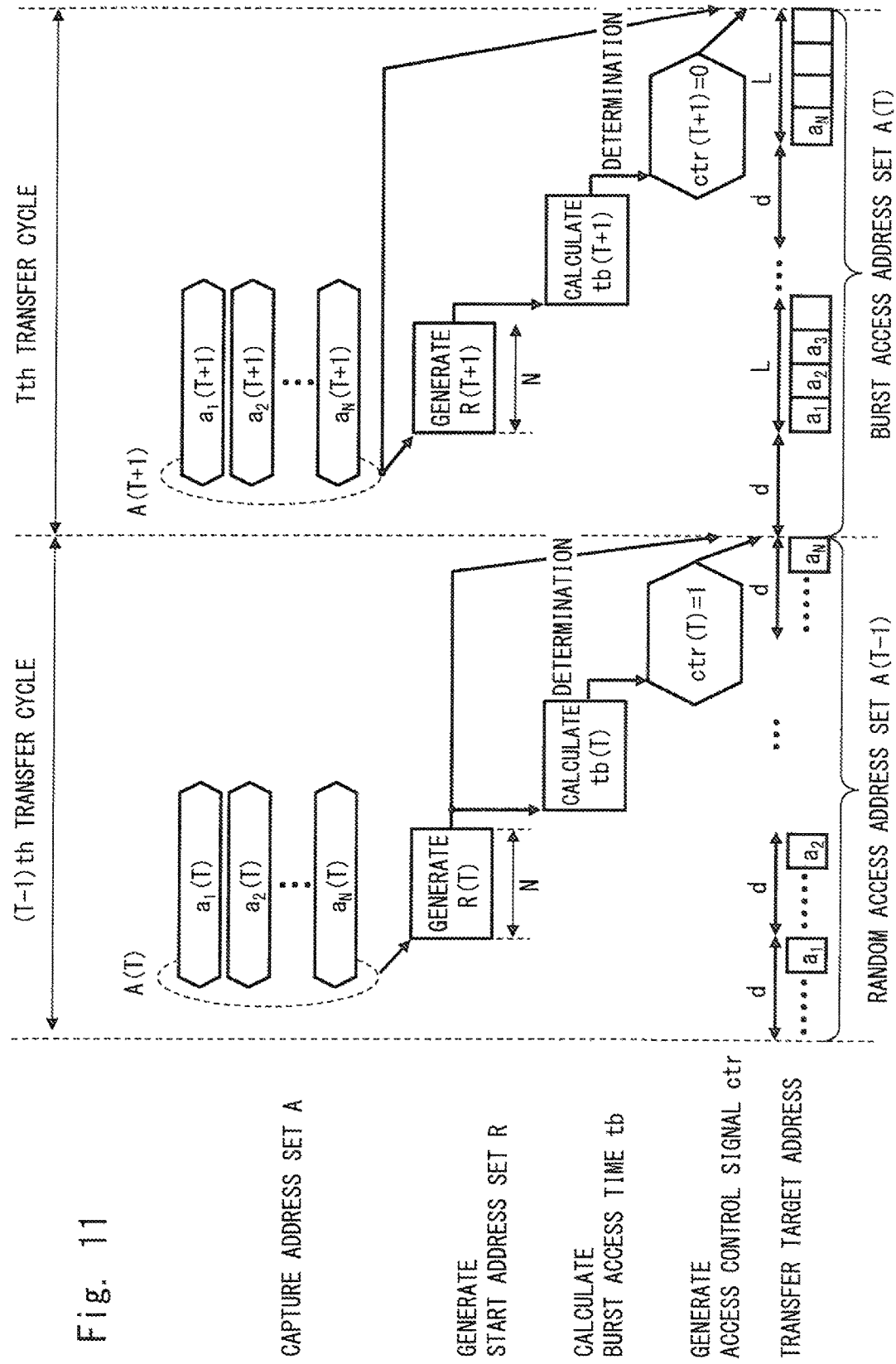
FIG. 11 is a timing chart for explaining an operation of a memory access control unit 20 according to the second embodiment.

Next, an operation of the memory access control unit 20 is explained with reference to FIG. 11. FIG. 11 is a timing chart for explaining an operation of the memory access control unit 20 according to the second embodiment. In FIG. 11, (T−1)th and Tth transfer cycles are shown. Note that the illustration of the determination flag set signal B is omitted in FIG. 11.

Firstly, the (T−1)th transfer cycle is explained.

When the (T−1)th transfer cycle is started, the memory access control unit 20 first captures (i.e., acquires) an address set signal A(T) and a determination flag set signal B(T) in the next Tth transfer cycle as shown in the uppermost part in FIG. 11. Note that the address set signal A(T) is held in the target address holding unit 27.

Next, as shown in the second part from the top in FIG. 11, the start address generation unit 21 generates a start address set signal R(T) in the next Tth transfer cycle. As described above, the generation of the start address set signal R(T) takes N clock cycles. Note that the start address set signal R(T) is held in the start address holding unit 28.

Next, as shown in the third part from the top in FIG. 11, the access method determination unit 22 calculates a burst access time tb(T) in the next Tth transfer cycle.

Subsequently, as shown in the fourth part from the top in FIG. 11, the access method determination unit 22 compares the calculated burst access time tb(T) with a random access time tr and generates a access control signal ctr(T). In the example shown in FIG. 11, it is assumed that the access control signal ctr(T) is one (ctr(T)=1). That is, burst access is selected. As a result, in the Tth transfer cycle, an address set signal A(T) is transferred by the burst access. Note that the access control signal ctr(T) is held in the control signal holding unit 23.

Meanwhile, as shown in the lowermost part in FIG. 11, in the (T−1)th transfer cycle, the address set signal A(T−1), which has been held in the target address holding unit 27, is transferred by random access. This is because the value of an access control signal ctr(T−1), which has been held in the control signal holding unit 23, was zero (not shown). As shown in the (T−1)th transfer cycle, in the case of the random access, the transfer is started as soon as the address set signal A(T−1) is captured (i.e., acquired) without waiting for the generation of the start address set signal R(T−1).

Next, the Tth transfer cycle is explained.

When the Tth transfer cycle is started, the memory access control unit 20 first captures (i.e., acquires) an address set signal A(T+1) and a determination flag set signal B(T+1) in the next (T+1)th transfer cycle as shown in the uppermost part in FIG. 11. Note that the address set signal A(T+1) is held in the target address holding unit 27.

Next, as shown in the second part from the top in FIG. 11, the start address generation unit 21 generates a start address set signal R(T+1) in the next Tth transfer cycle. The generation of the start address set signal R(T+1) also takes N clock cycles. Note that the start address set signal R(T+1) is held in the start address holding unit 28.

Next, as shown in the third part from the top in FIG. 11, the access method determination unit 22 calculates a burst access time tb(T+1) in the next (T+1)th transfer cycle.

Subsequently, as shown in the fourth part from the top in FIG. 11, the access method determination unit 22 compares the calculated burst access time tb(T+1) with a random access time trend generates an access control signal ctr(T+1). In the example shown in FIG. 11, it is assumed that the access control signal ctr(T) is zero (ctr(T)=0). That is, random access is selected. As a result, in the (T+1)th transfer cycle, an address set signal A(T+1) is transferred by the random access (not shown). Note that the access control signal ctr(T+1) is held in the control signal holding unit 23.

Meanwhile, as shown in the lowermost part in FIG. 11, in the Tth transfer cycle, the start address set signal R(T), which was stored into the start address holding unit 28 in the (T−1)th transfer cycle, is transferred by burst access. This is because the value of an access control signal ctr(T), which was stored into the control signal holding unit 23 in the (T−1)th transfer cycle, was one as described above.

As shown in FIG. 3, in the first embodiment, when the access is the burst access, it is necessary to start the transfer of the address set signal A(T) after generating the start address set signal R(T). In contrast to this, in this embodiment, since the start address set signal R(T) is generated in advance, the transfer can be started immediately when the Tth transfer cycle is started even when the access is the burst access as shown in FIG. 11. Therefore, the N clock cycles, which are necessary to generate the start address set signal R in the first embodiment, are unnecessary in the second embodiment.

Therefore, the burst access time tb (clock cycles) in the second embodiment can be expressed by the following expression by using the burst access number M (number of times), the access delay d (clock cycles), and the burst length L (words).

$$tb = M \times (d+L)$$

Further, in the first embodiment, the access control signal ctr(T−1) generated from the address set signal A(T−1) in the (T−1)th transfer cycle is used to transfer the address set signal A(T) in the Tth transfer cycle. In contrast to this, in this embodiment, the access control signal ctr(T), which is generated from the address set signal A(T), is used to transfer the address set signal A(T) in the Tth transfer cycle. Therefore, it is possible to switch the access between the burst access and the random access in a more appropriate manner and thereby to improve the access efficiency even further.

<Explanation of Memory Access Control Method>

Figure 12:
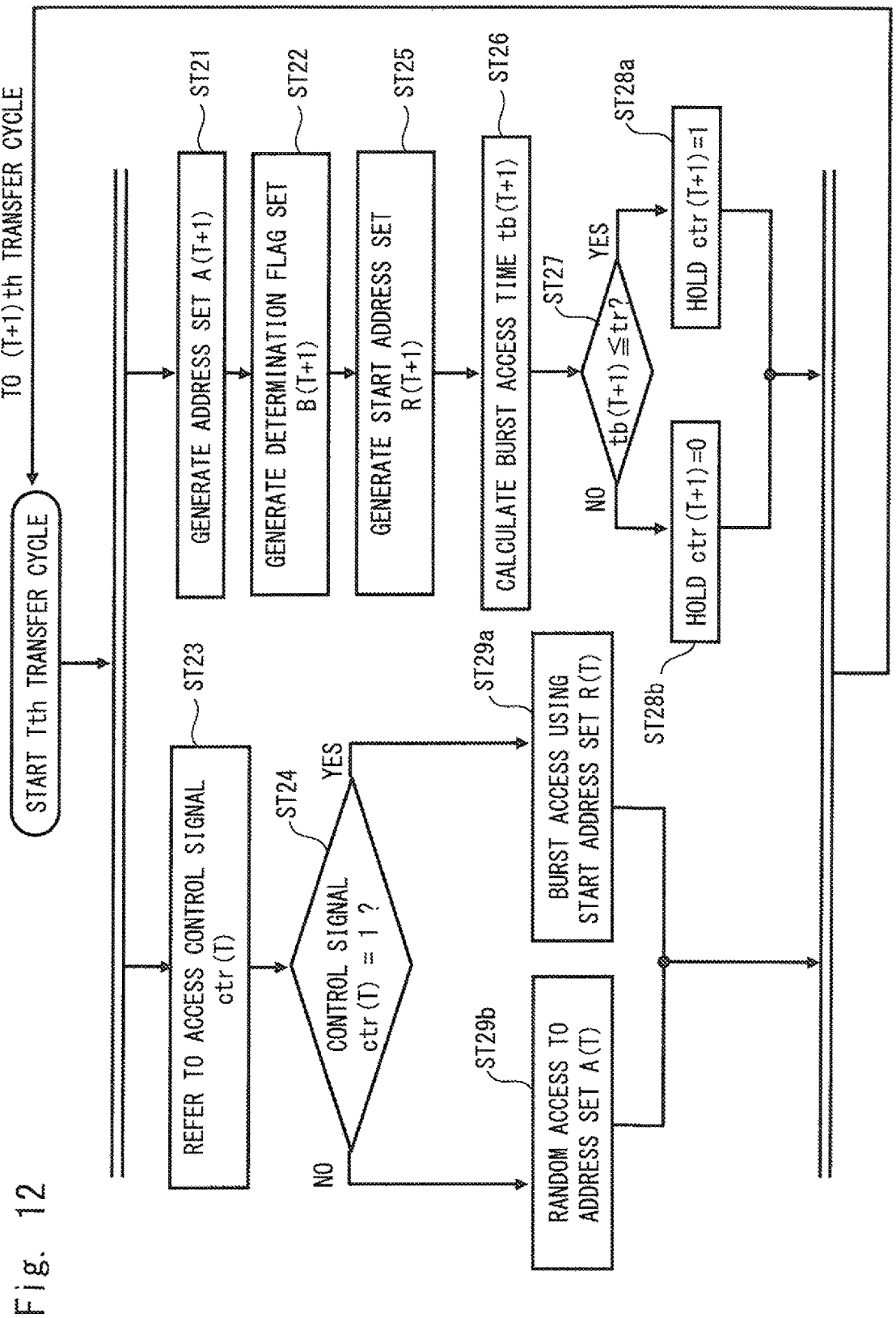
FIG. 12 is a flowchart for explaining a memory access control method according to the second embodiment.

Next, a memory access control method according to the second embodiment is explained with reference to FIG. 12. Fig. 12 is a flowchart for explaining a memory access control method according to the second embodiment. FIG. 12 shows a memory access control method in the Tth transfer cycle.

As shown in FIG. 12, when the Tth transfer cycle is started, a flow shown in the left side and a flow shown in the right side are processed in parallel with each other. Firstly, the flow on the left side is explained.

When the Tth transfer cycle is started, the memory access control unit 20 refers to an access control signal ctr(T), which is an access control signal ctr in the Tth transfer cycle, held in the control signal holding unit 23 (step ST23).

When the access control signal ctr(T) is one (ctr(T−1)=1), i.e., when the access is burst access (Yes at step ST24), the address set signal A(T) is accessed by the burst access by using the start address set signal R(T), which has been held in the start address holding unit 28 (step ST29a). When the access control signal ctr(T) is zero (ctr(T−1)=0), i.e., when the access is random access (No at step ST24), the address set signal A(T), which has been held in the target address holding unit 27, is accessed by the random access (step ST29b). After the step 29a or 29b is finished, the process moves to the (T+1)th transfer cycle.

Next, the flow on the right side is explained.

When the Tth transfer cycle is started, the operation cores $PE_1$ to $PE_N$ generate their respective target addresses $a_1$ to $a_N$ (address set signal A(T+1)), which are target addresses in the next (T+1)th transfer cycle, in the operation circuit 10 (step ST21).

Subsequently, each of the operation cores $PE_1$ to $PE_N$ generates a respective one of the determination flags $b_1$ to $b_N$ (determination flag set signal B(T+1)) indicating whether or not its own target address and another target address immediately prior to that target address in the accessing order can be accessed by the same burst access (step ST22).

Next, the start address generation unit 21 generates a start address set signal R(T+1), which is a start address set signal in the next (T+1)th transfer cycle (step ST25).

Next, the access method determination unit 22 calculates a burst access time tb(T+1), which is a burst access time in the next (T+1)th transfer cycle (step ST26). Further, the access method determination unit 22 compares the calculated burst access time tb(T+1) with a random access time tr (step ST27). When tb(T+1)≤tr (Yes at step ST27), the access method determination unit 22 stores an access control signal ctr(T+1) having a value 1 (ctr(T)=1) indicating the burst access into the control signal holding unit 23 (step ST28). When tb(T+1)>tr (No at step ST27), the access method determination unit 22 stores an access control signal ctr(T+1) having a value 0 (ctr(T)=0) indicating the random access into the control signal holding unit 23 (step ST28b).

Other Embodiments

Other embodiments are explained with reference to FIGS. 13 to 15.

Figure 13:
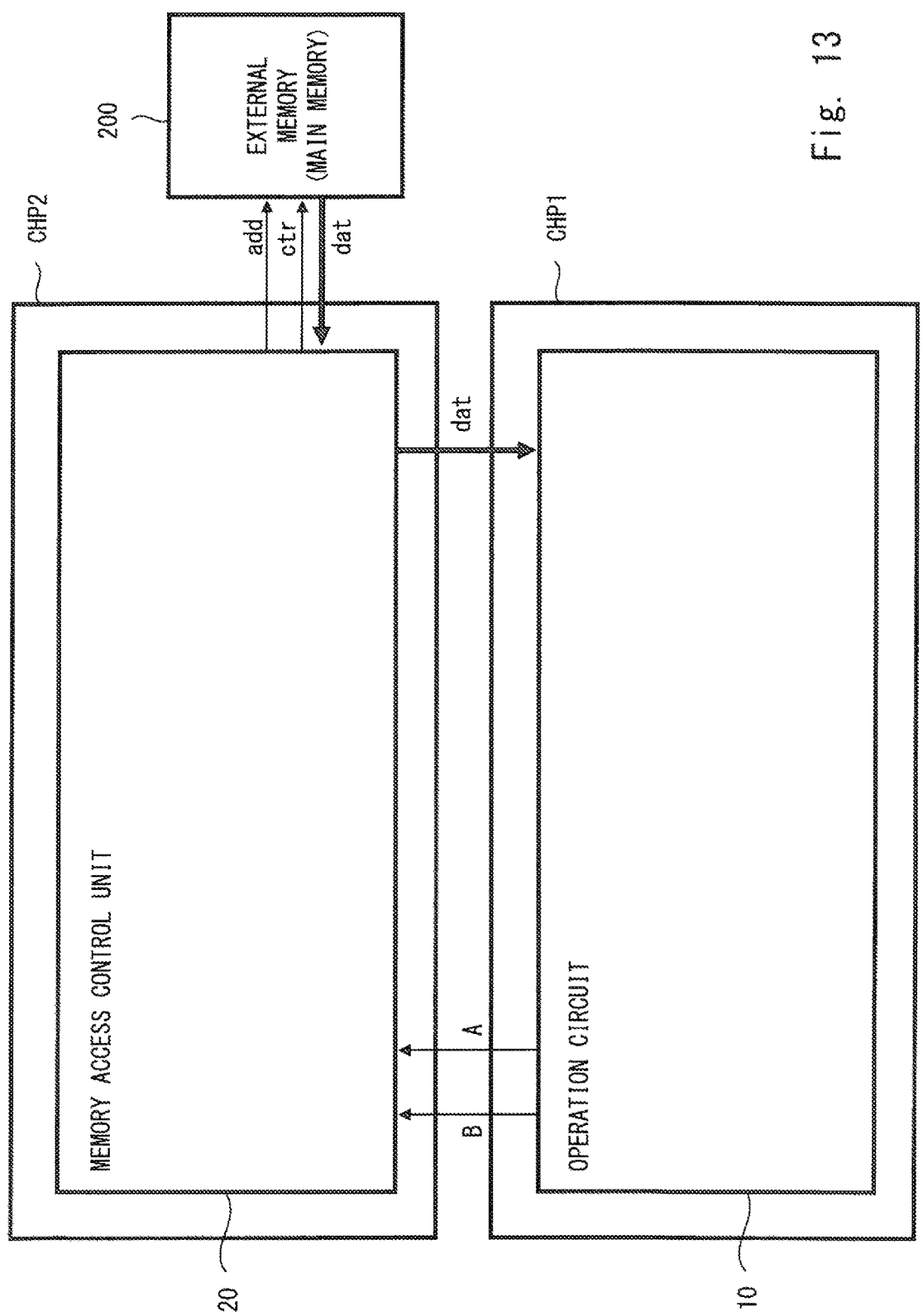
FIG. 13 shows a modified example of the semiconductor device shown in FIG. 1.

FIG. 13 shows a modified example of FIG. 1. in FIG. 1, the operation circuit 10 and the memory access control unit 20 are formed on the single semiconductor chip (i.e., the same semiconductor chip). However, as shown in FIG. 13, the operation circuit 10 and the memory access control unit 20 may be formed on different semiconductor chips CHP1 and CHP2.

Figure 14:
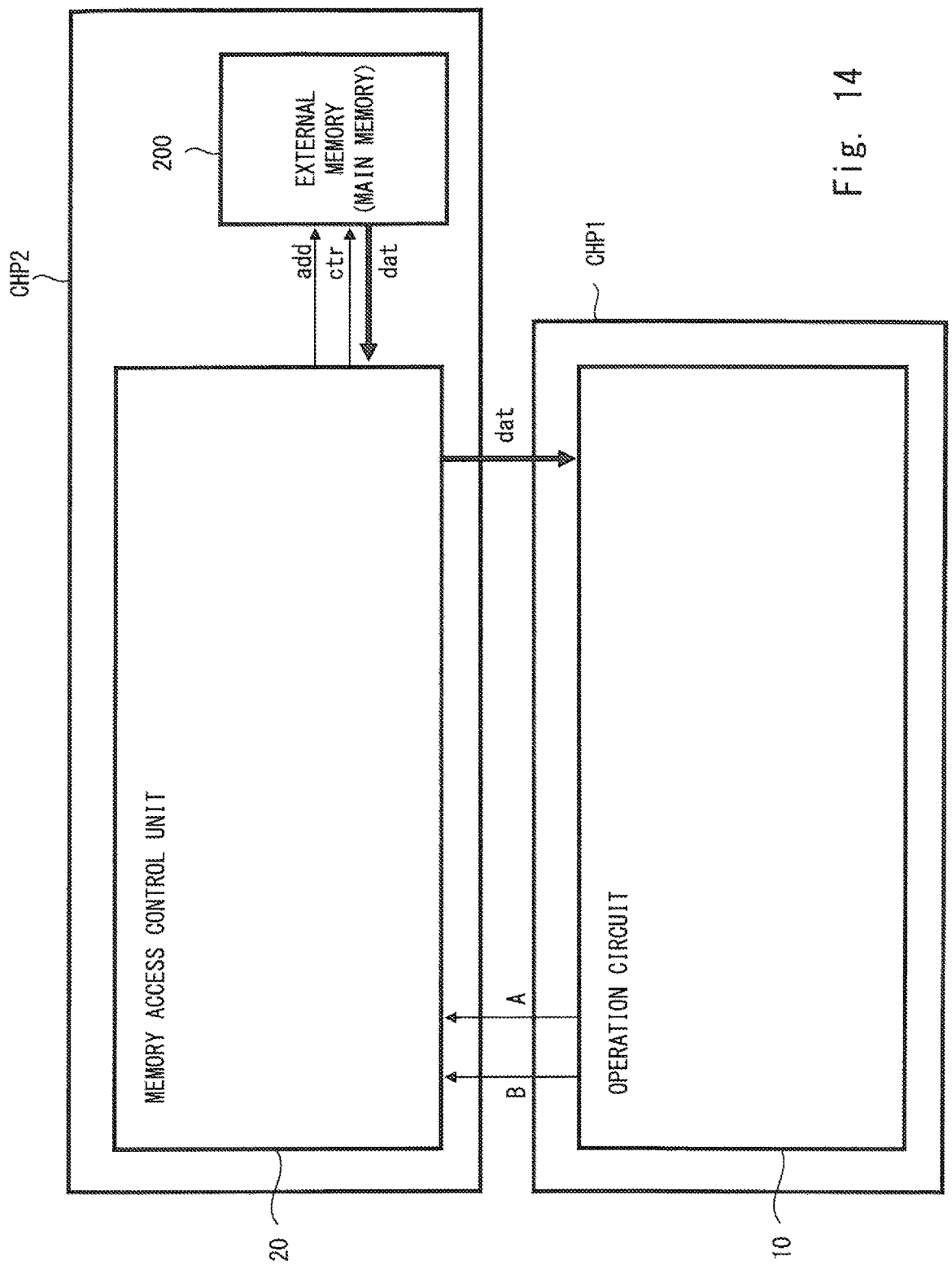
FIG. 14 shows a modified example of the semiconductor device shown in FIG. 13.

FIG. 14 shows a modified example of FIG. 13. In FIG. 13, the memory access control unit 20 and the external memory 200 are formed on the different semiconductor chips. However, as shown in FIG. 14, the memory access control unit 20 and the external memory 200 may be formed on the single semiconductor chip (i.e., the same semiconductor chip). Note that similarly to FIG. 13, the operation circuit 10 is formed on the semiconductor chip CHP1 different from the semiconductor chip CHP2.

Figure 15:
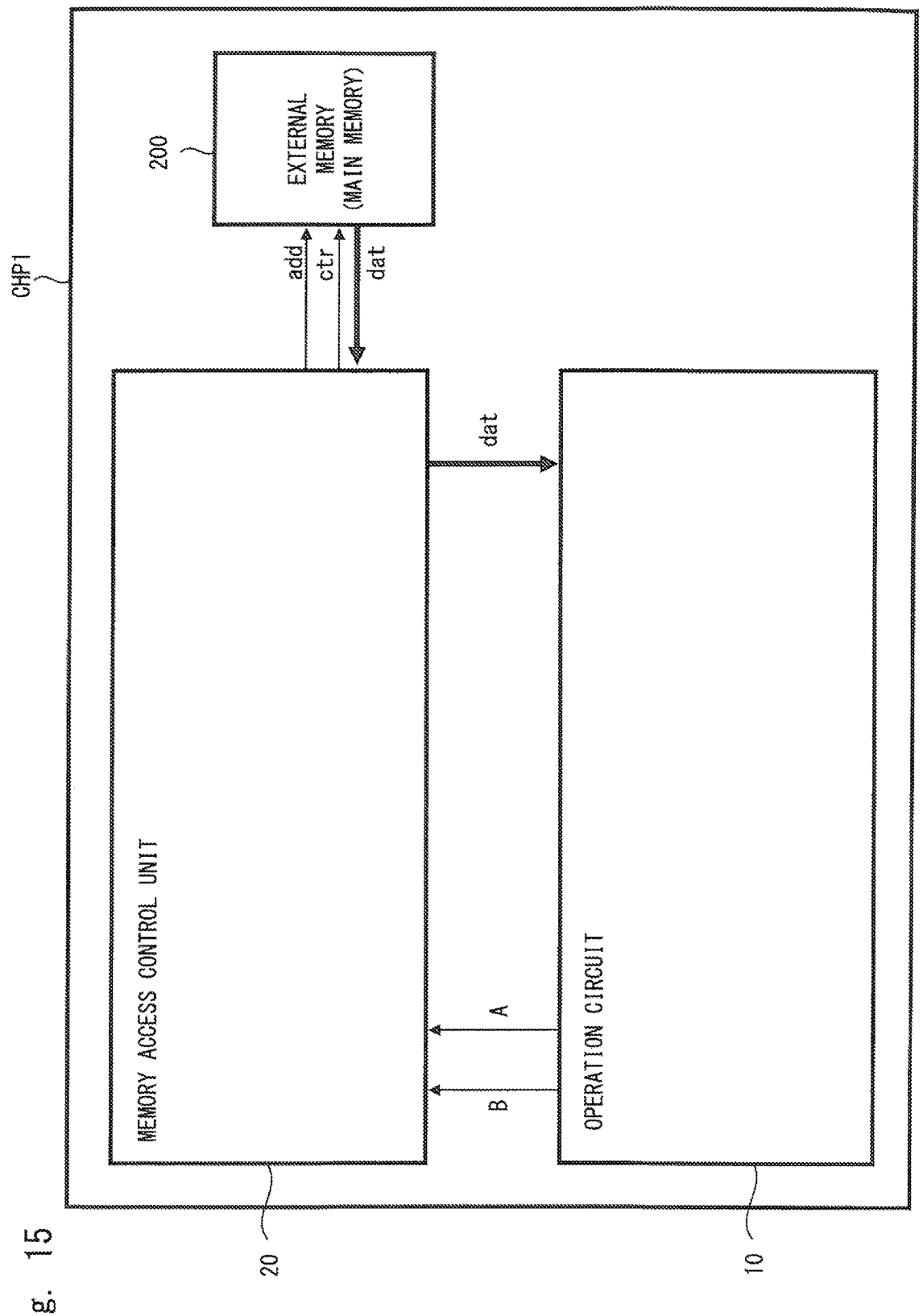
FIG. 15 shows another modified example of the semiconductor device shown in FIG. 1.

FIG. 15 shows a modified example of FIG. 1. in FIG. 1, the operation circuit 10 and the memory access control unit 20 are formed on the semiconductor chip different from the semiconductor chip on which the external memory 200 is formed. However, as shown in FIG. 15, all of the operation circuit 10, the memory access control unit 20, and the external memory 200 may be formed on the single semiconductor chip (i.e., the same semiconductor chip).

The present invention made by the inventors has been explained above in a specific manner based on embodiments. However, the present invention is not limited to the above-described embodiments, and needless to say, various modifications can be made without departing from the spirit and scope of the present invention.

For example, although reading operations are explained in the embodiements, needless to say, the present invention can be applied to writing operations.

Further, for example, the semiconductor device according to the above-described embodiment may have a configuration in which the conductivity type (p-type or n-type) of the semiconductor substrate, the semiconductor layer, the diffusion layer (diffusion region), and so on may be reversed. Therefore, when one of the n-type and p-type is defined as a first conductivity type and the other is defined as a second conductivity type, the first and second conductivity types may be the p-type and -type, respectively. Alternatively, the first and second conductivity types may be the n-type and p-type, respectively.

The first and second embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising:
an operation circuit configured to request access to an address set of an external memory, the address set including N addresses (N being a natural number no less than two); and
a memory access control unit configured to determine an access method for the address set of the external memory, the access method being one of a random access and a burst access,
wherein the memory access control circuit determines the access method by:
determining, for each address included in the address set, whether an address and another address adjacent to that address in an accessing order can be accessed by a same burst access;
determining a total number of burst accesses needed to access the addresses included in the address set;
calculating an access time it will take to access the address set based on the total number of burst accesses needed to access the address set;
comparing the calculated access time with an access time that it will take to access the address set by random access; and
selecting the access method based on a result of the comparing.

2. The semiconductor device according to claim 1, wherein the operation circuit comprises N operation cores each of which accesses a respective one of the N addresses.

3. The semiconductor device according to claim 2, wherein
the address set includes a first address and a second address adjacent to the first address in the accessing order,
the N operation cores include a first operation core that accesses the first address, and a second operation core that accesses the second address, and
the second operation core determines whether or not the first and second addresses can be accessed by the same burst access.

4. The semiconductor device according to claim 3, wherein
the second operation core:
determines that the first and second addresses should be accessed by the same burst access when values of integral parts of quotients obtained by dividing address values of the first and second addresses by a burst length are equal to each other, and
determines that the first and second addresses should not be accessed by the same burst access when the values of the integral parts differ from each other.

5. The semiconductor device according to claim 1, wherein the memory access control unit calculates the access time for accessing the address set by the burst access by using a burst length and an access delay.

6. The semiconductor device according to claim 1, wherein the external memory includes an SDRAM.

7. A memory access control method comprising:
requesting access to an address set of an external memory, the address set including N addresses (N being a natural number no less than two); and
determining an access method for the address set of the external memory, the access method being one of a random access and a burst access,
wherein the determining the access method includes:
determining, for each address included in the address set, whether an address and another address adjacent to that address in an accessing order can be accessed by a same burst access;
determining a total number of burst accesses needed to access the addresses included in the address set;
calculating an access time it will take to access the address set based on the total number of burst accesses needed to access the address set;
comparing the calculated access time with an access time it will take to access the address set by random access; and
selecting one of the random access and the burst access as the access method based on a result of the comparing.

8. The memory access control method according to claim 7, wherein
the address set includes a first address and a second address adjacent to the first address in the accessing order, and
when determining whether or not the access is made by the same burst access,
it is determined that the first and second addresses should be accessed by the same burst access when values of integral parts of quotients obtained by dividing address values of the first and second addresses by a burst length are equal to each other, and
it is determined that the first and second addresses should not be accessed by the same burst access when the values of the integral parts differ from each other.

9. The memory access control method according to claim 7, wherein the access time for accessing the address set by the burst access is calculated by using a burst length and an access delay.

10. The memory access control method according to claim 7, wherein the external memory includes an SDRAM.

11. A semiconductor device system comprising:
an operation circuit configured to request access to an address set, the address set including N addresses (N being a natural number no less than two);
a main memory including the address set; and
a memory access control unit configured to determine an access method for the address set of the main memory, the access method being one of a random access and a burst access, and the address set being one about to be accessed by the operation circuit,
wherein the memory access control circuit comprises:
a start address generation unit configured to:
determine, for each address included in the address set, whether an address and another address adjacent to that address in an accessing order can be accessed by a same burst access; and
extract a start address
for each burst access needed to access the address set; and
an access method determination unit configured to:
calculate an access time it will take to access the address set based on the number of start addresses needed;

compare the calculated access time with an access time that it will take to access the address set by random access; and select the access method based on a result of the comparing.

12. The semiconductor device system according to claim 11, wherein the operation circuit comprises N operation cores each of which accesses a respective one of the N addresses.

13. The semiconductor device system according to claim 12, wherein the address set includes a first address and a second address adjacent to the first address in the accessing order, the N operation cores include a first operation core that accesses the first address, and a second operation core that accesses the second address, and the second operation core determines whether or not the first and second addresses can be accessed by the same burst access.

14. The semiconductor device system according to claim 13, wherein the second operation core:

determines that the first and second addresses should be accessed by the same burst access when values of integral parts of quotients obtained by dividing address values of the first and second addresses by a burst length are equal to each other, and determines that the first and second addresses should not be accessed by the same burst access when the values of the integral parts differ from each other.

15. The semiconductor device system according to claim 11, wherein the memory access control unit calculates the access time for accessing the address set by the burst access by using a burst length and an access delay.

16. The semiconductor device system according to claim 11, wherein the main memory includes an SDRAM.

* * * * *